United States Patent
Song et al.

(10) Patent No.: US 11,895,878 B2
(45) Date of Patent: Feb. 6, 2024

(54) DISPLAY SUBSTRATE AND METHOD FOR MANUFACTURING THE SAME AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Erlong Song, Beijing (CN); Chaoxin Yun, Beijing (CN); Wenbo Hu, Beijing (CN); Shun Zhang, Beijing (CN); Zhengwei Luo, Beijing (CN); Huijie Meng, Beijing (CN); Yongkang Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 746 days.

(21) Appl. No.: 16/977,807

(22) PCT Filed: Nov. 25, 2019

(86) PCT No.: PCT/CN2019/120578
§ 371 (c)(1),
(2) Date: Sep. 2, 2020

(87) PCT Pub. No.: WO2021/102626
PCT Pub. Date: Jun. 3, 2021

(65) Prior Publication Data
US 2023/0095451 A1    Mar. 30, 2023

(51) Int. Cl.
*H10K 59/124*    (2023.01)
*H10K 59/131*    (2023.01)
*H10K 59/122*    (2023.01)

(52) U.S. Cl.
CPC ......... *H10K 59/131* (2023.02); *H10K 59/122* (2023.02)

(58) Field of Classification Search
CPC .................. H10K 59/122–124; H10K 59/131
See application file for complete search history.

(56) References Cited

U.S. PATENT DOCUMENTS

2018/0032189 A1   2/2018   Lee et al.
2018/0145127 A1   5/2018   Shin et al.
(Continued)

FOREIGN PATENT DOCUMENTS

CN   107819013 A   3/2018
CN   108153017 A   6/2018
(Continued)

OTHER PUBLICATIONS

European Patent Office, Extended European Search Report Issued in Application No. 19945460.4, dated Oct. 21, 2022, Germany, 10 pages.
(Continued)

*Primary Examiner* — Hoa B Trinh
(74) *Attorney, Agent, or Firm* — McCoy Russell LLP

(57) ABSTRACT

The present disclosure provides a display substrate and a method for manufacturing the same and a display device. The display substrate includes: an array of sub-pixels, a signal line and a first retaining wall structure. A first conductive pattern of the signal line is between a base substrate and a second conductive pattern of the signal line. An orthographic projection of a second portion of the first retaining wall structure on the base substrate partially over-
(Continued)

laps an orthographic projection of the first conductive pattern on the base substrate; a boundary of the orthographic projection of the second portion on the base substrate distal to the array of sub-pixels, is between the array of sub-pixels and a boundary of the orthographic projection of the first conductive pattern on the base substrate distal to the array of sub-pixels. The orthographic projection of the second portion on the base substrate partially overlaps the orthographic projection of the second conductive pattern on the base substrate; a boundary of the orthographic projection of the second conductive pattern on the base substrate close to the array of sub-pixels, is between the array of sub-pixels and a boundary of the orthographic projection of the second portion on the base substrate, close to the array of sub-pixels.

27 Claims, 6 Drawing Sheets

(56) References Cited

U.S. PATENT DOCUMENTS

| | | |
|---|---|---|
| 2018/0151838 A1 | 5/2018 | Park et al. |
| 2018/0158894 A1 | 6/2018 | Park et al. |
| 2018/0342564 A1 | 11/2018 | Hanari |
| 2019/0252482 A1 | 8/2019 | Choi |
| 2020/0006449 A1 | 1/2020 | Yu et al. |
| 2021/0118957 A1* | 4/2021 | Yang ............... G06F 3/0443 |
| 2021/0327904 A1* | 10/2021 | Li ..................... H10K 77/10 |

FOREIGN PATENT DOCUMENTS

| | | |
|---|---|---|
| CN | 108878480 A | 11/2018 |
| CN | 108899316 A | 11/2018 |
| CN | 107068720 B | 8/2019 |
| JP | 2018200787 A | 12/2018 |
| JP | 2019091642 A | 6/2019 |

OTHER PUBLICATIONS

Japanese Patent Office, Office Action Issued in Application No. 2021-572623, dated Oct. 3, 2023, 10 pages. (Submitted with Machine Translation).

* cited by examiner

DISPLAY SUBSTRATE AND METHOD FOR MANUFACTURING THE SAME AND DISPLAY DEVICE

CROSS-REFERENCE TO RELATED APPLICATIONS

This application is the U.S. National Phase of International Application No. PCT/CN2019/120578 filed on Nov. 25, 2019. The entire contents of the above-listed application is hereby incorporated by reference for all purposes.

TECHNICAL FIELD

The present disclosure relates to the field of display technologies, in particular to a display substrate, a method for manufacturing the same and a display device.

BACKGROUND

Active-matrix organic light-emitting diode (AMOLED) display devices have gradually become the mainstream of display panel development due to their low power consumption, flexibility, and large size.

The display device includes a display region and an edge region located at a periphery of the display region. A signal line and a driving chip are disposed in the display region. The signal line is used to transmit a signal provided by the driving chip to a conductive pattern in the display region. A retaining wall structure is further disposed in the display region. When the display device is packaged by using thin film packaging technology, the retaining wall structure can effectively block packaging material to prevent the packaging material from flowing out of the edge region of the display device.

SUMMARY

An object of the present disclosure is to provide a display substrate, a method for manufacturing the same and a display device.

According to a first aspect of the present disclosure, a display substrate is provided and includes: a base substrate; an array of sub-pixels on the base substrate; a signal line; wherein the signal line includes a first conductive pattern and a second conductive pattern which are stacked on each other, and the first conductive pattern is located between the base substrate and the second conductive pattern; a first retaining wall structure; wherein the first retaining wall structure surrounds the array of sub-pixels; the first retaining wall structure includes a first portion and a second portion; an orthographic projection of the first portion on the base substrate does not overlap with an orthographic projection of the signal line on the base substrate; an orthographic projection of the second portion on the base substrate is partially overlapped with an orthographic projection of the first conductive pattern on the base substrate; a boundary of the orthographic projection of the second portion on the base substrate, which is distal to the array of sub-pixels, is located between an orthographic projection of the array of sub-pixels on the base substrate, and a boundary of the orthographic projection of the first conductive pattern on the base substrate, which is distal to the array of sub-pixels; the orthographic projection of the second portion on the base substrate is partially overlapped with an orthographic projection of the second conductive pattern on the base substrate; a boundary of the orthographic projection of the second conductive pattern on the base substrate, which is close to the array of sub-pixels, is located between the orthographic projection of the array of sub-pixels on the base substrate, and a boundary of the orthographic projection of the second portion on the base substrate, which is close to the array of sub-pixels.

Optionally, the display substrate further includes a second retaining wall structure; wherein the second retaining wall structure surrounds the array of sub-pixels; an orthographic projection of the second retaining wall structure on the base substrate is located between the orthographic projection of the first wall structure on the base substrate and the orthographic projection of the array of sub-pixels on the base substrate; the second retaining wall structure includes a third portion and a fourth portion; an orthographic projection of the third portion on the base substrate does not overlap with the orthographic projection of the signal line on the base substrate; an orthographic projection of the fourth portion on the base substrate at least partially overlaps the orthographic projection of the first conductive pattern on the base substrate; the orthographic projection of the fourth portion on the base substrate at least partially overlaps the orthographic projection of the second conductive pattern on the base substrate.

Optionally, a boundary of the orthographic projection of the first conductive pattern on the base substrate, which is close to the array of sub-pixels, is located between the orthographic projection of the array of sub-pixels on the base substrate, and a boundary of the orthographic projection of the fourth portion on the base substrate, which is close to the array of sub-pixels; and/or, a boundary of the orthographic projection of the second conductive pattern on the base substrate, which is close to the array of sub-pixels, is located between the orthographic projection of the array of sub-pixels on the base substrate, and a boundary of the orthographic projection of the fourth portion on the base substrate, which is close to the array of sub-pixels.

Optionally, the second conductive pattern includes a second transition portion and a second main portion that is coupled with the second transition portion; a boundary of an orthographic projection of the second transition portion on the base substrate, which is distal to the array of sub-pixels, is located within the orthographic projection of the fourth portion on the base substrate.

Optionally, the second conductive pattern includes a second transition portion and a second main portion that is coupled with the second transition portion; a boundary of an orthographic projection of the second main portion on the base substrate, which is distal to the array of sub-pixels, is located within the orthographic projection of the second portion on the base substrate.

Optionally, the second conductive pattern further includes a first lateral side; an orthographic projection of the first lateral side on the base substrate is located between the orthographic projection of the first retaining wall structure on the base substrate and the orthographic projection of the second retaining wall structure on the base substrate.

Optionally, the first lateral side is located at a corner area of the display substrate.

Optionally, the first conductive pattern includes a first transition portion and a first main portion that is coupled with the first transition portion; the second conductive pattern includes a second transition portion and a second main portion that is coupled with the second transition portion; a boundary of an orthographic projection of the second main portion on the base substrate, which is close to the array of sub-pixels, is located between the orthographic projection of the array of sub-pixels on the base substrate and a boundary of an orthographic projection of the first main portion on the base substrate, which is close to the array of sub-pixels.

Optionally, the first conductive pattern includes a first transition portion and a first main portion that is coupled with the first transition portion; the second conductive pattern includes a second transition portion and a second main portion that is coupled with the second transition portion; a part of a boundary of an orthographic projection of the second transition portion on the base substrate, which is close to the array of sub-pixels, is located between the orthographic projection of the array of sub-pixels on the base substrate and a boundary of an orthographic projection of the first transition portion on the base substrate, which is close to the array of sub-pixels; another part of the boundary of the orthographic projection of the second transition portion on the base substrate, which is close to the array of sub-pixels, is located within the orthographic projection of the first transition portion on the base substrate.

Optionally, the display substrate further includes a wire-in region; the orthographic projection of the first conductive pattern on the base substrate at least partially overlaps with the wire-in region; and the orthographic projection of the second conductive pattern on the base substrate does not overlap with the wire-in region.

Optionally, the display substrate further includes a corner area and a straight-edge area; in a direction perpendicular to an extension direction of the first conductive pattern, a width of the first conductive pattern in the corner area is greater than a width of the first conductive pattern in the straight-edge area.

Optionally, in a direction from the corner area to the straight-edge area, a distance between the boundary of the orthographic projection of the first conductive pattern on the base substrate, which is distal to the array of sub-pixels, and the boundary of the orthographic projection of the second portion on the base substrate, which is distal to the array of sub-pixels, is gradually decreased.

Optionally, the display substrate further includes a first insulating layer at one side of the first conductive pattern away from the base substrate; the first insulating layer covers a lateral side of a first edge portion of the first conductive pattern, and a surface of the first edge portion distal to the base substrate; and the first edge portion is an edge portion of the first conductive pattern away from the array of sub-pixels.

Optionally, the display substrate further includes: a plurality of sub-pixel driving circuits, wherein each of the plurality of sub-pixel driving circuits includes a plurality of thin film transistors; anode patterns disposed on one side of the plurality of sub-pixel driving circuits distal to the base substrate, wherein the anode patterns are corresponding to the plurality of sub-pixel driving circuits in a one-to-one manner; a plurality of conductive connection portions arranged between the anode patterns and the plurality of sub-pixel driving circuits, wherein each of the plurality of conductive connecting portions is respectively coupled to the corresponding anode pattern and the corresponding sub-pixel driving circuit; wherein the first conductive pattern is in direct contact with the second conductive pattern; the first conductive pattern and source and drain electrodes of the plurality of thin film transistors include the same material; the second conductive pattern and the plurality of conductive connection portions include the same material.

Optionally, the display substrate further includes a second insulating layer and a third insulating layer; the first conductive pattern, the source and drain electrodes of the plurality of thin film transistors are all located on one surface of the second insulating layer distal to the base substrate; the second conductive pattern and the plurality of conductive connection portions are all located on one surface of the third insulating layer distal to the base substrate.

Optionally, the display substrate further includes a compensation conductive pattern; the compensation conductive pattern is located on one side of the signal line distal to the base substrate, and is coupled to the signal line.

Optionally, a boundary of an orthographic projection of the compensation conductive pattern on the base substrate, which is distal to the array of sub-pixels, is located within the orthographic projection of the second portion on the base substrate.

Optionally, the orthographic projection of the fourth portion of the second retaining wall structure on the base substrate is located within the orthographic projection of the compensation conductive pattern on the base substrate.

Optionally, the display substrate further includes a fourth insulating layer; the compensation conductive pattern and the anode patterns are located on one surface of the fourth insulating layer distal to the base substrate.

Optionally, the display substrate further includes a common electrode layer disposed on one side of the compensation conductive pattern distal to the base substrate; the common electrode layer includes a portion located in a display region of the display substrate and a portion located in an edge region of the display substrate; the portion of the common electrode layer located in the edge region is coupled to the compensation conductive pattern.

Optionally, the display substrate further includes: a first passivation layer disposed on one side of the plurality of thin film transistors distal to the base substrate; a first planarization layer disposed on one side of the first passivation layer distal to the base substrate; a second planarization layer disposed on one side of the first planarization layer distal to the base substrate; a pixel defining layer disposed on one side of the second planarization layer distal to the base substrate; a spacer layer disposed on one side of the pixel defining layer distal to the base substrate; wherein the first retaining wall structure includes a first retaining wall block, a second retaining wall block, a third retaining wall block and a fourth retaining wall block, which are sequentially stacked in a direction away from the base substrate; the first retaining wall block is in the same layer and made of the same material as the first planarization layer; the second retaining wall block is in the same layer and made of the same material as the second planarization layer; the third retaining wall block is in the same layer and made of the same material as the pixel defining layer; the fourth retaining wall block is in the same layer and made of the same material as the spacer layer; the second retaining wall structure includes a fifth retaining wall block, a sixth retaining wall block and a seventh retaining wall block that are sequentially stacked in the direction away from the base substrate; the fifth retaining wall block is in the same layer and made of the same material as the second planarization layer; the sixth retaining wall block is in the same layer and made of the same material as the pixel defining layer; the seventh retaining wall block is in the same layer and made of the same material as the spacer layer.

Optionally, the compensation conductive pattern includes a portion located between the second retaining wall block and the third retaining wall block, and a portion located between the fifth retaining wall block and the sixth retaining wall block.

Optionally, the second conductive pattern includes a portion located between the first retaining wall block and the second retaining wall block.

Optionally, the signal line includes a positive power signal line and/or a negative power signal line.

Optionally, the signal line surrounds the array of sub-pixels.

Based on the above technical solution of the display substrate, according to a second aspect of the present disclosure, a display device is provided and includes the above display substrate.

Based on the above technical solution of the display substrate, according to a third aspect of the present disclosure, a method for manufacturing a display device is provided and includes: forming an array of sub-pixels, a signal line and a first retaining wall structure on a base substrate; wherein the signal line includes a first conductive pattern and a second conductive pattern that are stacked on each other, the first conductive pattern is located between the second conductive pattern and the base substrate; the first retaining wall structure surrounds the array of sub-pixels and includes a first portion and a second portion; an orthographic projection of the first portion on the base substrate does not overlap with an orthographic projection of the signal line on the base substrate; an orthographic projection of the second portion on the base substrate is at least partially overlapped with an orthographic projection of the first conductive pattern on the base substrate; a boundary of the orthographic projection of the second portion on the base substrate, which is distal to the array of sub-pixels, is located between an orthographic projection of the array of sub-pixels on the base substrate, and a boundary of the orthographic projection of the first conductive pattern on the base substrate, which is distal to the array of sub-pixels; the orthographic projection of the second portion on the base substrate is partially overlapped with an orthographic projection of the second conductive pattern on the base substrate; a boundary of the orthographic projection of the second conductive pattern on the base substrate, which is close to the array of sub-pixels, is located between the orthographic projection of the array of sub-pixels on the base substrate, and a boundary of the orthographic projection of the second portion on the base substrate, which is close to the array of sub-pixels.

BRIEF DESCRIPTION OF THE DRAWINGS

The drawings described herein are used to provide further understanding of the present disclosure and constitute a part of the present disclosure. Exemplary embodiments of the present disclosure and their descriptions are used to explain the present disclosure, and do not constitute an improper limitation to the present disclosure. In the drawings.

DETAILED DESCRIPTION

In order to further illustrate the display substrate, the method for manufacturing the same and the display device according to embodiments of the present disclosure, a detailed description is given below with reference to the accompanying drawings in the specification.

At present, when a large-size display substrate is realized, since a signal line on the display substrate has a longer length, the signal line has a large resistance, which leads to a large IR drop when the signal line transmits signals and then affects display uniformity of the display substrate.

Figure 1:
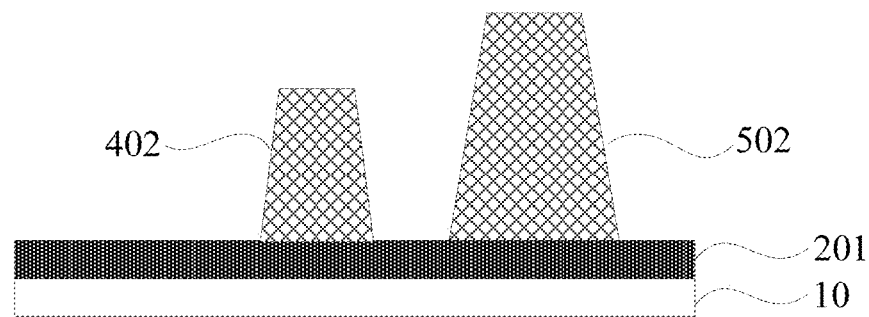
FIG. 1 is a first schematic diagram of a signal line in a display substrate according to an embodiment of the present disclosure.
Figure 4:
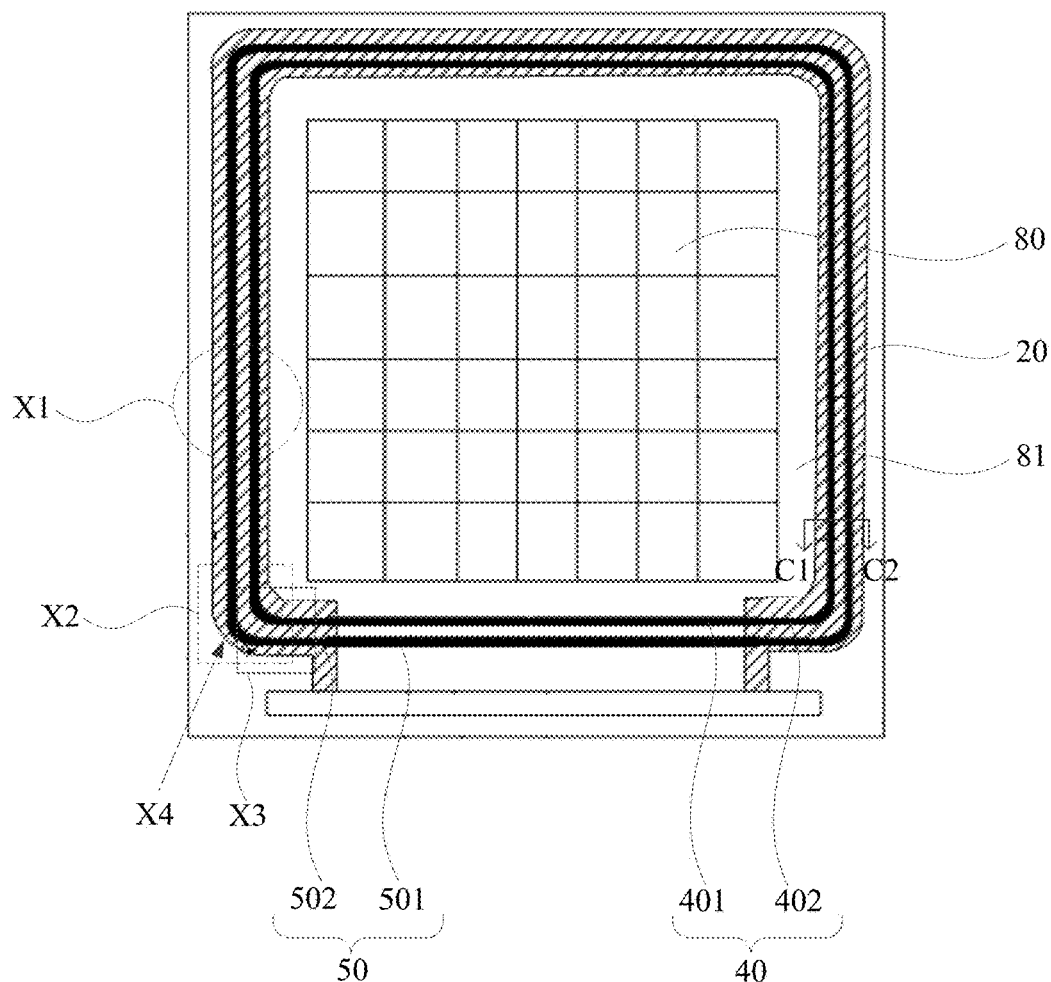
FIG. 4 is a schematic top view of a display substrate according to an embodiment of the present disclosure.

In view of the above problems, as shown in FIG. 1 and FIG. 4, the present disclosure provides a display substrate. The display substrate includes a display region 80 and an edge region 81 surrounding the display region 80. A signal line 20 is disposed in the edge region 81. The signal line 20 includes a first conductive pattern 201.

A first retaining wall structure 50 and a second retaining wall structure 40 are further disposed in the edge region 81. The second retaining wall structure 40 is located between the first retaining wall structure 50 and the display region 80. The first retaining wall structure 50 includes a first portion 501 and a second portion 502. The first portion 501 and the second portion 502 jointly surround the display region 80 of the display substrate. The second retaining wall structure 40 includes a third portion 401 and a fourth portion 402. The third portion 401 and the fourth portion 402 jointly surround the display region 80 of the display substrate.

An orthographic projection of the first portion 501 on a base substrate 10 does not overlap with an orthographic projection of the signal line 20 on the base substrate 10. An orthographic projection of the second portion 502 on the base substrate 10 is located with an orthographic projection of the first conductive pattern 201 on the base substrate 10. An orthographic projection of the third portion 401 on the base substrate 10 does not overlap with the orthographic projection of the signal line 20 on the base substrate 10. An orthographic projection of the fourth portion 402 on the base substrate 10 is located within the orthographic projection of the first conductive pattern 201 on the base substrate 10.

In the display substrate of the above structure, the orthographic projection of the second portion 502 of the first retaining wall structure 50 on the base substrate 10 is located within the orthographic projection of the first conductive pattern 201 on the base substrate 10, and the orthographic projection of the fourth portion 402 of the second retaining wall structure 40 on the base substrate 10 is located within the orthographic projection of the first conductive pattern 201 on the base substrate 10, thereby increasing a width of the signal line 20 in a direction perpendicular to an extension direction of the signal line 20. Therefore, in the above display substrate, the overall IR drop generated by the signal line 20 during signal transmission can be effectively reduced, and the display uniformity of the substrate display can be improved.

Figure 2:
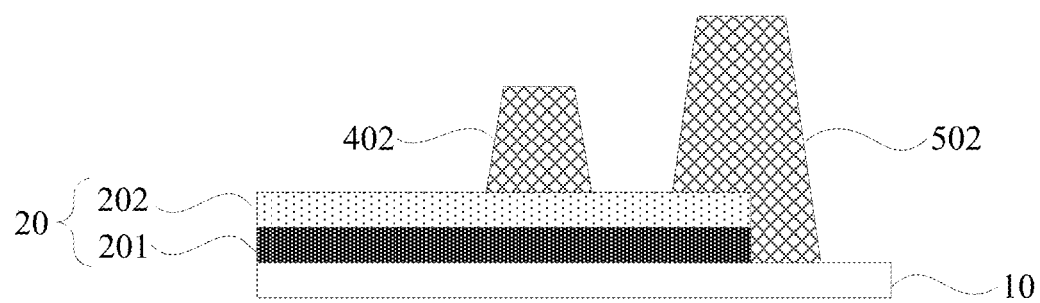
FIG. 2 is a second schematic diagram of a signal line in a display substrate according to an embodiment of the present disclosure.
Figure 3:
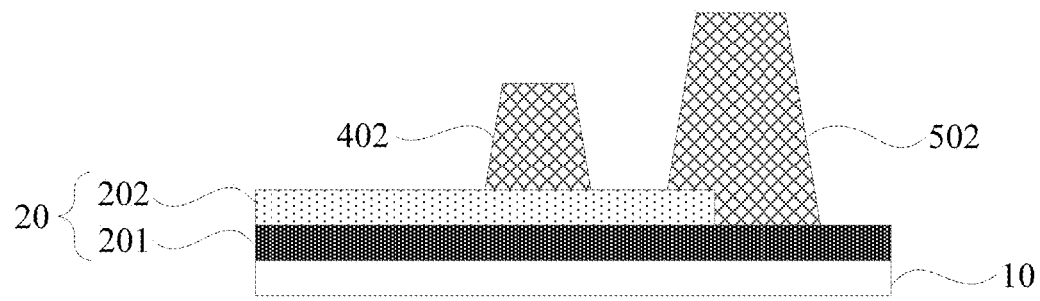
FIG. 3 is a third schematic diagram of a signal line in a display substrate according to an embodiment of the present disclosure.

Further, as shown in FIG. 2 and FIG. 4, the present disclosure provides a display substrate. The display substrate includes a display region 80 and an edge region 81 surrounding the display region 80. A signal line 20 is disposed in the edge region 81. The signal line 20 includes a first conductive pattern 201 and a second conductive pattern 202 that are stacked on each other. The first conductive pattern 201 is located between the second conductive pattern 202 and the base substrate 10 of the display substrate.

A first retaining wall structure 50 and a second retaining wall structure 40 are further disposed in the edge region 81. The second retaining wall structure 40 is located between the first retaining wall structure 50 and the display region 80. The first retaining wall structure 50 includes a first portion 501 and a second portion 502. The first portion 501 and the second portion 502 jointly surround the display region 80 of the display substrate. The second retaining wall structure 40 includes a third portion 401 and a fourth portion 402. The third portion 401 and the fourth portion 402 jointly surround the display region 80 of the display substrate.

An orthographic projection of the first portion 501 on a base substrate 10 does not overlap with an orthographic projection of the signal line 20 on the base substrate 10. An orthographic projection of the second portion 502 on the base substrate 10 is partially overlapped with an orthographic projection of the first conductive pattern 201 on the base substrate 10. Further, the orthographic projection of the second portion 502 on the base substrate 10 is partially overlapped with an orthographic projection of the second conductive pattern 202 on the base substrate 10. An orthographic projection of the third portion 401 on the base substrate 10 does not overlap with the orthographic projection of the signal line 20 on the base substrate 10. An orthographic projection of the fourth portion 402 on the base substrate 10 is located within the orthographic projection of the first conductive pattern 201 on the base substrate 10. Further, the orthographic projection of the fourth portion 402 on the base substrate 10 is located within the orthographic projection of the second conductive pattern 202 on the base substrate 10.

In the display substrate of the above structure, the signal line 20 includes the first conductive pattern 201 and the second conductive pattern 202 which are stacked on each other, thereby increasing a thickness of the signal line 20 in a direction perpendicular to the base substrate 10. Meanwhile, the first conductive pattern 201 and the second conductive pattern 202 are arranged according to the above projection relationship, so that a width of each of the first conductive pattern 201 and the second conductive pattern 201 is increased in a direction perpendicular to an extension direction of the signal line 20. Therefore, in the above display substrate, the overall IR drop generated by the signal line 20 during signal transmission can be effectively reduced, and the display uniformity of the substrate display can be improved.

The display substrate of the above structure has a certain effect in reducing the IR drop on the signal line 20 and improving the display uniformity of the display substrate, however, the effect is significant. In view of this, the present disclosure provides the following technical solutions.

As shown in FIG. 3, FIG. 4, FIG. 6 and FIG. 7, one embodiment of the present disclosure provides a display substrate, which includes a base substrate 10, a plurality of sub-pixels arranged in an array on the base substrate 10, a signal line and a first retaining wall structure. The signal line 20 includes a first conductive pattern 201 and a second conductive pattern 202 which are stacked on each other. The first conductive pattern 201 is located between the base substrate 10 and the second conductive pattern 202. The first retaining wall structure 50 surrounds the array of sub-pixels. The first retaining wall structure 50 includes a first portion 501 and a second portion 502. An orthographic projection of the first portion 501 on the base substrate 10 does not overlap with an orthographic projection of the signal line 20 on the base substrate 10. An orthographic projection of the second portion 502 on the base substrate 10 is partially overlapped with an orthographic projection of the first conductive pattern 201 on the base substrate 10. A boundary (indicated by 38 in FIG. 7) of the orthographic projection of the second portion 502 on the base substrate 10, which is distal to the array of sub-pixels, is located between an orthographic projection of the array of sub-pixels on the base substrate 10, and a boundary (indicated by 31 in FIG. 7) of the orthographic projection of the first conductive pattern 201 on the base substrate 10, which is distal to the array of sub-pixels. The orthographic projection of the second portion 502 on the base substrate 10 is partially overlapped with an orthographic projection of the second conductive pattern 202 on the base substrate 10. A boundary (indicated by 34 in FIG. 7) of the orthographic projection of the second conductive pattern 202 on the base substrate 10, which is close to the array of sub-pixels, is located between the orthographic projection of the array of sub-pixels on the base substrate 10, and a boundary (indicated by 37 in FIG. 7) of the orthographic projection of the second portion 502 on the base substrate 10, which is close to the array of sub-pixels.

Specifically, the display substrate includes a display region 80 and an edge region 81 surrounding the display region 80. Taking a rectangular display substrate as an example, the display region 80 is a rectangle, and is provided with a plurality of sub-pixels arranged in arrays. The edge region 81 surrounds four sides of the display region 80. The edge region 81 is bound with a chip, and is further provided with a signal line 20 coupled with the chip. The binding position of the chip and the arrangement of the signal line 20 may be set according to actual needs. As shown in FIG. 4, for example, the chip is bound on one side of the display substrate, and the signal line 20 extends along the other three sides of the display substrate. Two ends of the signal line 20 are coupled to the chip. The two ends of the signal line 20 are located in a wire-in region of the display substrate.

The first retaining wall structure 50 has various structures. For example, the first retaining wall structure 50 surrounds the array of sub-pixels, and the first retaining wall structure 50 may be divided into a first portion 501 and a second portion 502. An orthographic projection of the first portion 501 on the base substrate 10 does not overlap with an orthographic projection of the signal line 20 on the base substrate 10. An orthographic projection of the second portion 502 on the base substrate 10 at least partially overlaps with the orthographic projection of the first conductive pattern 201 on the base substrate 10. The orthographic projection of the second portion 502 on the base substrate 10 at least partially overlaps with the orthographic projection of the second conductive pattern 202 on the base substrate 10.

Meanwhile, a boundary of the orthographic projection of the second portion 502 on the base substrate 10, which is distal to the array of sub-pixels, is located between an orthographic projection of the array of sub-pixels on the base substrate 10, and a boundary of the orthographic projection of the first conductive pattern 201 on the base substrate 10, which is distal to the array of sub-pixels. A boundary of the orthographic projection of the second conductive pattern 202 on the base substrate 10, which is close to the array of sub-pixels, is located between the orthographic projection of the array of sub-pixels on the base substrate 10, and a boundary of the orthographic projection of the second portion 502 on the base substrate 10, which is close to the array of sub-pixels. The first retaining wall structure 50 and the signal line 20 of the above structure enable the first conductive pattern 201 to have a wider width in a direction perpendicular to an extension direction of the first conductive pattern 201. Meanwhile, the first retaining wall structure 50 and the signal line 20 of the above structure enable the second conductive pattern 202 to have a wider width in a direction perpendicular to an extension direction of the second conductive pattern 202. In this way, a width of the signal line 20 in a direction perpendicular to an extension direction of the signal line 20 is increased, which is more conducive to reducing the IR drop of the signal line 20.

According to the specific structure of the display substrate, in the display substrate according to one embodiment of the present disclosure, the signal line 20 has a thicker thickness in a direction perpendicular to the base substrate 10, and the signal line 20 has a wider width in the direction perpendicular to the extension direction of the signal line 20, therefore, the display substrate according to the embodiment of the present disclosure is more conducive to reducing the IR drop of the signal line 20 and improving the display uniformity of the display substrate.

In some embodiments, the display substrate further includes a second retaining wall structure 40. The second retaining wall structure 40 surrounds the array of sub-pixels. An orthographic projection of the second retaining wall structure 40 on the base substrate 10 is located between the orthographic projection of the first wall structure 50 on the base substrate 10 and the orthographic projection of the array of sub-pixels on the base substrate 10. The second retaining wall structure 40 includes a third portion 401 and a fourth portion 402. An orthographic projection of the third portion 401 on the base substrate 10 does not overlap with the orthographic projection of the signal line 20 on the base substrate 10. An orthographic projection of the fourth portion 402 on the base substrate 10 at least partially overlaps the orthographic projection of the first conductive pattern 201 on the base substrate 10. The orthographic projection of the fourth portion 402 on the base substrate 10 at least partially overlaps the orthographic projection of the second conductive pattern 202 on the base substrate 10.

Specifically, the display substrate further includes the second retaining wall structure 40 that surrounds the array of sub-pixels. The second retaining wall structure 40 may be located between the first retaining wall structure 50 and the array of sub-pixels and nested with the first retaining wall structure 50 to enhance the blocking ability to the packaging material.

The second retaining wall structure 40 has various structures. For example, the second retaining wall structure 40 may be divided into a third portion 401 and a fourth portion 402. An orthographic projection of the third portion 401 on the base substrate 10 does not overlap with an orthographic projection of the signal line 20 on the base substrate 10. An orthographic projection of the fourth portion 402 on the base substrate 10 at least partially overlaps with the orthographic projection of the first conductive pattern 201 on the base substrate 10. The orthographic projection of the fourth portion 402 on the base substrate 10 at least partially overlaps with the orthographic projection of the second conductive pattern 202 on the base substrate 10. The second retaining wall structure 40 and the signal line 20 of the above structure enable the first conductive pattern 201 to have a wider width in a direction perpendicular to an extension direction of the first conductive pattern 201, and enable the second conductive pattern 202 to have a wider width in a direction perpendicular to an extension direction of the second conductive pattern 202. In this way, a width of the signal line 20 in a direction perpendicular to an extension direction of the signal line 20 is increased, which is more conducive to reducing the IR drop of the signal line 20.

Figure 6:
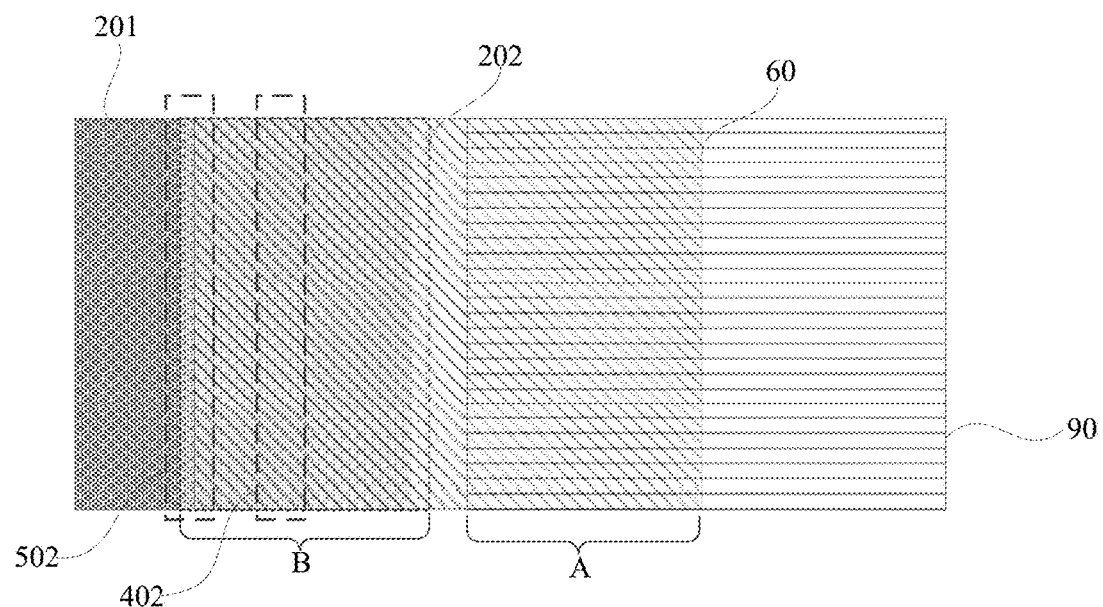
FIG. 6 is a schematic enlarged view of the part X1 in FIG. 4.

As shown in FIG. 6, in some embodiments, a boundary (indicated by 32 in FIG. 7) of the orthographic projection of the first conductive pattern 201 on the base substrate 10, which is close to the array of sub-pixels, is located between an orthographic projection of the array of sub-pixels on the base substrate 10, and a boundary (indicated by 39 in FIG. 7) of the orthographic projection of the fourth portion 402 on the base substrate 10, which is close to the array of sub-pixels; and/or, a boundary (indicated by 34 in FIG. 7) of the orthographic projection of the second conductive pattern 202 on the base substrate 10, which is close to the array of sub-pixels, is located between an orthographic projection of the array of sub-pixels on the base substrate 10, and a boundary (indicated by 39 in FIG. 7) of the orthographic projection of the fourth portion 402 on the base substrate 10, which is close to the array of sub-pixels.

Specifically, the boundary of the orthographic projection of the first conductive pattern 201 on the base substrate 10, which is close to the array of sub-pixels, is located between the orthographic projection of the array of sub-pixels on the base substrate 10, and the boundary of the orthographic projection of the fourth portion 402 on the base substrate 10, which is close to the array of sub-pixels, so that both of the orthographic projection of the second portion 502 on the base substrate and the orthographic projection of the fourth portion 402 on the base substrate are located within the orthographic projection of the first conductive pattern 201 on the base substrate 10, thereby enabling the first conductive pattern 201 to have a wider width in the direction perpendicular to the extension direction of the first conductive pattern 201.

The boundary of the orthographic projection of the second conductive pattern 202 on the base substrate 10, which is close to the array of sub-pixels, is located between the orthographic projection of the array of sub-pixels on the base substrate 10, and the boundary of the orthographic projection of the fourth portion 402 on the base substrate 10, which is close to the array of sub-pixels, so that the orthographic projection of the fourth portion 402 on the base substrate is located within the orthographic projection of the second conductive pattern 202 on the base substrate 10, thereby enabling the second conductive pattern 202 to have a wider width in the direction perpendicular to the extension direction of the second conductive pattern 202.

Figure 8:
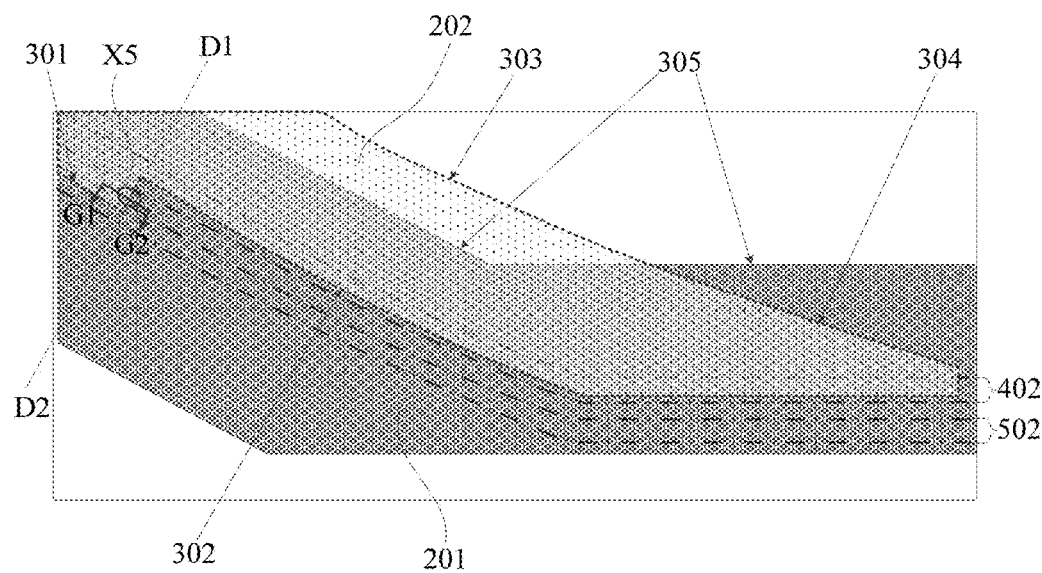
FIG. 8 is a first schematic enlarged view of the part X2 in FIG. 4.

As shown in FIG. 8, in some embodiments, the second conductive pattern 202 includes a second transition portion and a second main portion that are coupled. A boundary (indicated by 302 shown in FIG. 8) of an orthographic projection of the second transition portion on the base substrate 10, which is distal to the array of sub-pixels, is located within the orthographic projection of the fourth portion 402 on the base substrate 10.

In some embodiments, a boundary (indicated by 301 shown in FIG. 8) of an orthographic projection of the second main portion on the base substrate 10, which is distal to the array of sub-pixels, is located within the orthographic projection of the second portion 502 on the base substrate 10.

Specifically, the second transition portion is a portion at a right side of D1D2 in the second conductive pattern 202; the second main portion is a portion at a left side of D1D2 in the second conductive portion 202. The second transition portion is located at a corner area of the display substrate. The second main portion is located in a straight-edge area and/or the corner area of the display substrate.

In the above arrangement, the second conductive pattern 202 includes the second transition portion and the second main portion that is coupled with the second transition portion. The boundary of the orthographic projection of the second transition portion on the base substrate 10, which is distal to the array of sub-pixels, is located within the orthographic projection of the fourth portion 402 on the base substrate 10, thereby ensuring that the second transition portion has a wider width in the direction perpendicular to the extension direction of the second transition portion, while defining a wider distance between the second transition portion and a border of the display substrate in the corner area, which is more conducive to improving the signal transmission stability of the signal line 20.

In the above arrangement, the boundary of the orthographic projection of the second main portion on the base substrate 10, which is distal to the array of sub-pixels, is located within the orthographic projection of the second portion 502 on the base substrate 10, so as to ensure that the second transition portion has a wider width in the direction perpendicular to the extension direction of the second transition portion, without the need to provide a special protective layer to protect an edge of the second main portion distal to the array of sub-pixels, which effectively saves the manufacturing process of the display substrate.

Figure 9:
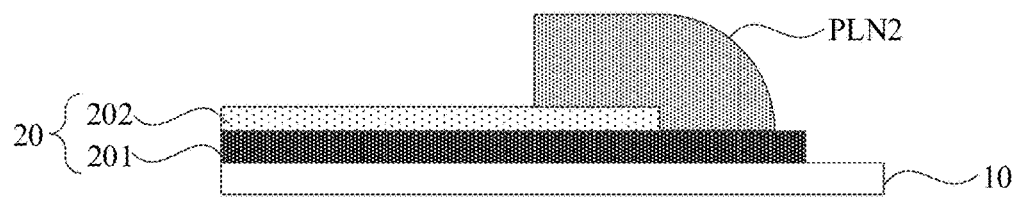
FIG. 9 is a schematic cross-sectional view of FIG. 8 taken along the direction G1G2.

As shown in FIG. 8 and FIG. 9, in some embodiments, the second conductive pattern 202 further includes a first lateral side X5. An orthographic projection of the first lateral side X5 on the base substrate is located between the orthographic projection of the first retaining wall structure (i.e., the second portion 502 included in the first retaining wall structure) on the base substrate and the orthographic projection of the second retaining wall structure (i.e., the fourth portion 402 included in the second retaining wall structure) on the base substrate.

Specifically, the second conductive pattern 202 has various structures. For example, the second conductive pattern 202 includes: a portion covered by the first retaining wall structure and the second retaining wall structure, and a connection portion. When the first retaining wall structure and the second retaining wall structure are spaced apart, the connection portion is not covered by the first retaining wall structure and the second retaining wall structure, and serves to electrically connect a portion of the second conductive pattern 202 covered by the first retaining wall structure to a portion of the second conductive pattern 202 covered by the second retaining wall structure. The connection portion has the first lateral side X5.

In some embodiments, the first lateral side X5 is located at a corner area of the display substrate.

Specifically, since the first lateral side X5 is not covered by the first retaining wall structure and the second retaining wall structure, and the first lateral side X5 is generally made of metal materials, there may be a risk of water vapor intrusion at the first lateral side X5. Thus, as mention above, the first lateral side X5 is disposed in the corner area of the display substrate, so that the first lateral side X5 is away from the display region of the display substrate, thereby better preventing water vapor from invading into the display region through the first lateral side X5.

Further, as shown in FIG. 9, since each of the first retaining wall structure and the second retaining wall structure may include a pattern formed by a material of a second planarization layer PLN2, a bordering area is defined between the first retaining wall structure and the second retaining wall structure by the second planarization layer PLN2. The first lateral side X5 is covered by the second planarization layer PLN2 in the bordering area, thereby better preventing water vapor from invading through the first lateral side X5.

It is worth noting that in some other embodiments, the first retaining wall structure and the second retaining wall structure may be set independently, and the first lateral side X5 is not covered by the second planarization layer PLN2.

Figure 7:
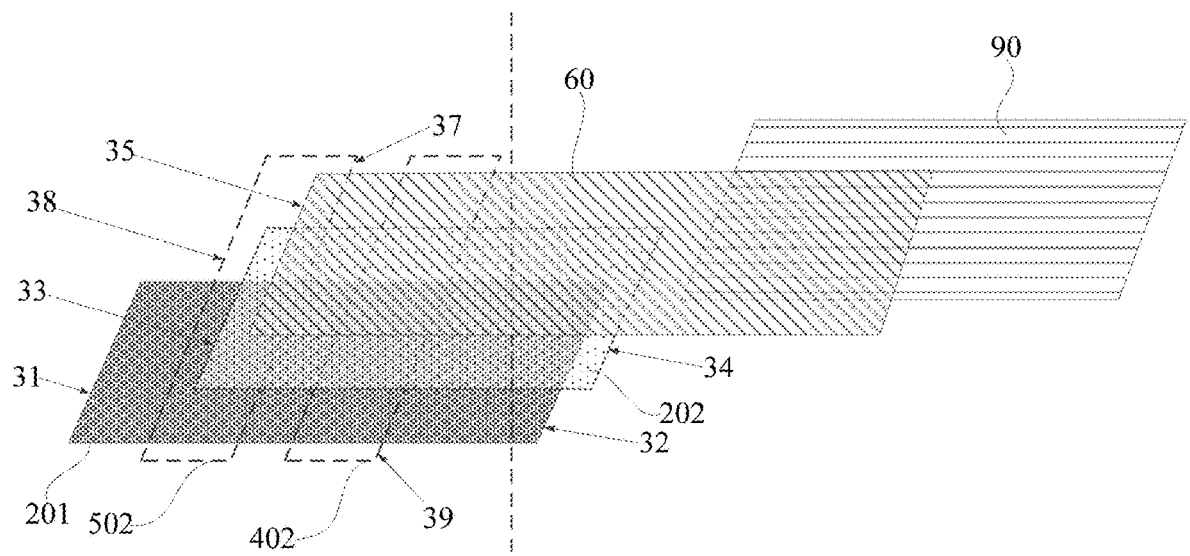
FIG. 7 is a schematic exploded view of FIG. 6.

As shown in FIG. 7, in some embodiments, the first conductive pattern 201 includes a first transition portion and a first main portion that are coupled to each other, and the second conductive pattern 202 includes a second transition portion and a second main portion that are coupled to each other. A boundary (indicated by 34 shown in FIG. 7) of an orthographic projection of the second main portion on the base substrate 10, which is close to the array of sub-pixels, is located between the orthographic projection of the array of sub-pixels on the base substrate 10 and a boundary (indicated by 32 shown in FIG. 7) of the orthographic projection of the first main portion on the base substrate 10, which is close to the array of sub-pixels.

Specifically, the boundary of the orthographic projection of the second main portion on the base substrate 10, which is close to the array of sub-pixels, is located between the orthographic projection of the array of sub-pixels on the base substrate 10 and the boundary of the orthographic projection of the first main portion on the base substrate 10, which is close to the array of sub-pixels, so that a boundary of the second main portion, which is close to the array of sub-pixels, is closer to the display region of the display substrate than a boundary of the first main portion, which is close to the array of sub-pixels. This can ensure that the first conductive pattern 201 has a wider width in the direction perpendicular to the extension direction of the first conductive pattern, and the second conductive pattern 202 has a wider width in the direction perpendicular to the extension direction of the second conductive pattern. Meanwhile, this can better reduce the possibility of short circuit between the first conductive pattern 201 and conductive functional patterns in the display region 80, thereby effectively improving operation stability of the display substrate.

As shown in FIG. 8, in some embodiments, the first conductive pattern 201 includes a first transition portion and a first main portion that are coupled to each other, and the second conductive pattern 202 includes a second transition portion and a second main portion that are coupled to each other. A part of a boundary (indicated by 303 shown in FIG. 8) of an orthographic projection of the second transition portion on the base substrate 10, which is close to the array of sub-pixels, is located between the orthographic projection of the array of sub-pixels on the base substrate 10 and a boundary (indicated by 305 shown in FIG. 8) of the orthographic projection of the first transition portion on the base substrate 10, which is close to the array of sub-pixels.

Another part of the boundary (indicated by 304 shown in FIG. 8) of the orthographic projection of the second transition portion on the base substrate 10, which is close to the array of sub-pixels, is located within the orthographic projection of the first transition portion on the base substrate 10.

In addition, in the above arrangement, one part of the boundary of the orthographic projection of the second transition portion on the base substrate 10, which is close to the array of sub-pixels, is located between the orthographic projection of the array of sub-pixels on the base substrate 10 and the boundary of the orthographic projection of the first transition portion on the base substrate 10, which is close to the array of sub-pixels; and another part of the boundary of the orthographic projection of the second transition portion on the base substrate 10, which is close to the array of sub-pixels, is located within the orthographic projection of the first transition portion on the base substrate 10. The another part is located between the one part and the wire-in region of the display substrate. In this way, a size of a part of the second transition portion far away from the wire-in region is larger, and a part of the second transition portion close to the wire-in region occupies a smaller layout space, which is beneficial to reducing the IR drop of the signal line 20 and allows the layout space near the wire-in region to be effectively used, thereby better avoiding short circuits between conductive functional patterns near the wire-in region and then ensuring the operation stability of the display substrate.

As shown in FIG. 6 and FIG. 7, in some embodiments, a boundary (indicated by 33 shown in FIG. 7) of an orthographic projection of the second main portion on the base substrate 10, which is distal to the array of sub-pixels, is located within the orthographic projection of the second portion 502 on the base substrate 10. A boundary (indicated by 34 shown in FIG. 7) of the orthographic projection of the second main portion on the base substrate 10, which is close to the array of sub-pixels, is located between the orthographic projection of the array of sub-pixels on the base substrate 10 and a boundary (indicated by 32 shown in FIG. 7) of an orthographic projection of the first main portion on the base substrate 10, which is close to the array of sub-pixels.

As shown in FIG. 6, with this arrangement, there is a large second overlapping area B between the first conductive pattern 201 and the second conductive pattern 202, so that a width of the signal line 20 in the direction perpendicular to the extension direction of the signal line 20 is widened, which is more conducive to reducing the IR drop of the signal line 20.

In some embodiments, the display substrate further includes a wire-in region. The orthographic projection of the first conductive pattern 201 on the base substrate 10 at least partially overlaps with the wire-in region. The orthographic projection of the second conductive pattern 202 on the base substrate 10 does not overlap with the wire-in region.

Figure 10:
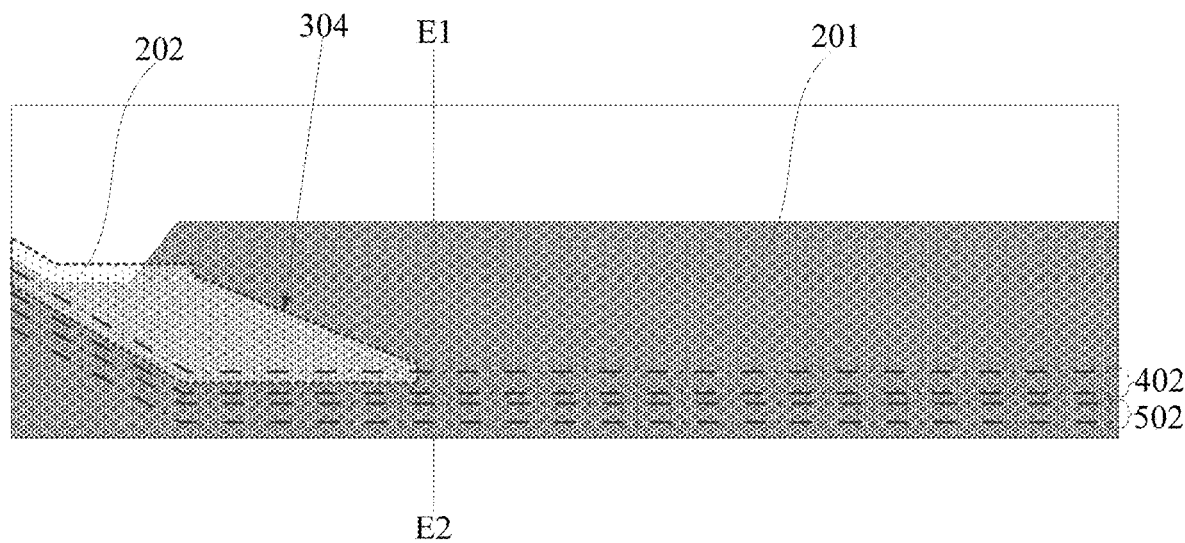
FIG. 10 is a schematic enlarged view of the part X3 in FIG. 4.

Specifically, as shown in FIG. 10, an area at a left of E1E2 is the corner area of the display substrate, and an area at a right of E1E2 is the wire-in region of the display substrate. Functional patterns in the wire-in region are directly coupled to a driving chip in the display substrate, and receives a driving signal provided by the driving chip.

When actually laying out the first conductive pattern 201 and the second conductive pattern 202, the orthographic projection of the first conductive pattern 201 on the base substrate 10 at least partially overlaps with the wire-in region, and the orthographic projection of the second conductive pattern 202 on the base substrate 10 does not overlap with the wire-in region, so that the signal line 20 can receive the driving signal provided by the driving chip only through the first conductive pattern 201. This layout can avoid laying out the second conductive pattern 202 in the wire-in region, so that the layout space in the wire-in region can be more effectively used, thereby better avoiding the short circuit between various conductive functional patterns in the wire-in region, and then ensuring the operation stability of the display substrate.

Figure 11:
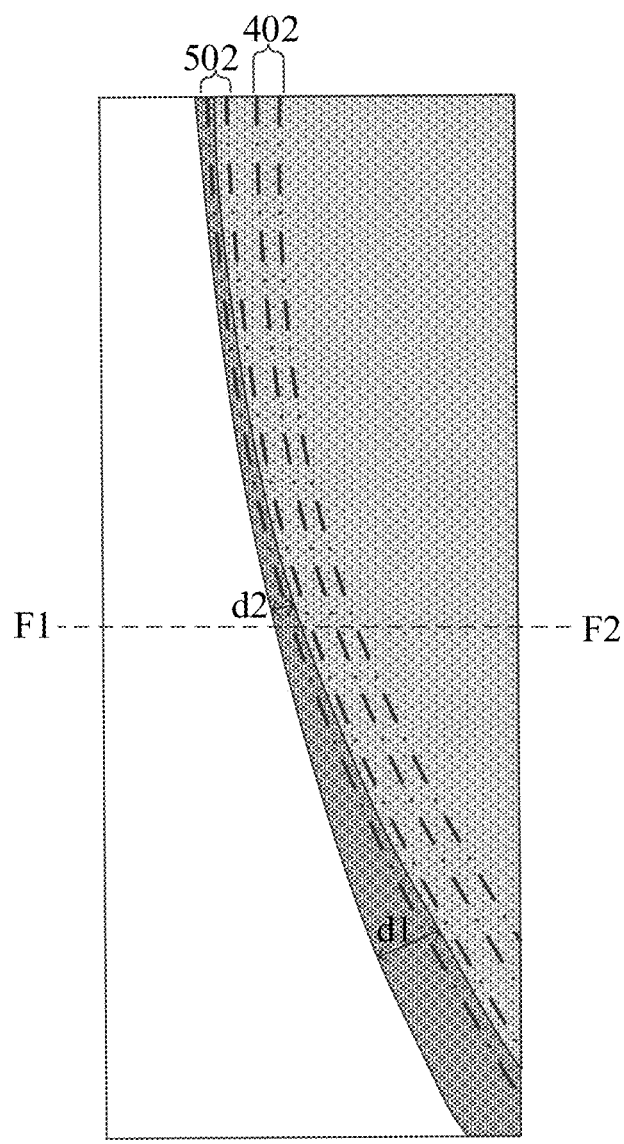
FIG. 11 is a schematic enlarged view of the part X4 in FIG. 4.

As shown in FIG. 11, in some embodiments, the display substrate further includes a corner area and a straight-edge area. In a direction perpendicular to an extension direction of the first conductive pattern, a width d1 of the first conductive pattern in the corner area is greater than a width d2 of the first conductive pattern in the straight-edge area.

Specifically, an area above F1F2 is the straight-edge area, and an area below F1F2 is the corner area. When the width of the first conductive pattern is set in the above manner, it can ensure that the entire width of the signal line 20 in the direction perpendicular to its extension direction is uniform, thereby better improving the transmission performance of the signal line 20.

It should be noted that taking a rectangular display substrate as an example, the display substrate includes four corner areas, and a straight-edge area located between adjacent corner areas for connecting the adjacent corner areas. The display substrate further includes a wire-in area. The wire-in area is located in one straight-edge area.

In some embodiments, in a direction from the corner area to the straight-edge area, a distance between the boundary of the orthographic projection of the first conductive pattern 201 on the base substrate 10, which is distal to the array of sub-pixels, and the boundary of the orthographic projection of the second portion 502 on the base substrate 10, which is distal to the array of sub-pixels, is gradually decreased.

Specifically, when laying out the first conductive pattern 201, the distance between the boundary of the orthographic projection of the first conductive pattern 201 on the base substrate 10, which is distal to the array of sub-pixels, and the boundary of the orthographic projection of the second portion 502 on the base substrate 10, which is distal to the array of sub-pixels, may be set to be gradually decreased. In this way, the boundary of the orthographic projection of the second transition portion on the base substrate 10, which is distal to the array of sub-pixels, is located within the orthographic projection of the fourth portion 402 on the base substrate 10; and the boundary of the orthographic projection of the second main portion on the base substrate 10, which is distal to the array of sub-pixels, is located within the orthographic projection of the second portion 502 on the base substrate 10. In this case, uniformity of the overall width of the signal line 20 in the direction perpendicular to its extension direction is improved, thereby better improving the transmission performance of the signal line 20.

In some embodiments, the boundary of the orthographic projection of the second main portion on the base substrate 10, which is distal to the array of sub-pixels, is located between the boundary of the orthographic projection of the first main portion on the base substrate 10, which is distal to the array of sub-pixels, and the boundary of the orthographic projection of the second portion on the base substrate, which is distal to the array of sub-pixels.

Specifically, according to the above arrangement, a stepped structure is defined between the edge of the first main portion distal to the array of sub-pixels and an edge of the second main portion distal to the array of sub-pixels. In this way, when an insulating layer is provided to cover the stepped structure, which is more conducive to reducing the difficulty in fabricating the insulating layer and improving the yield of the insulating layer.

Figure 5:
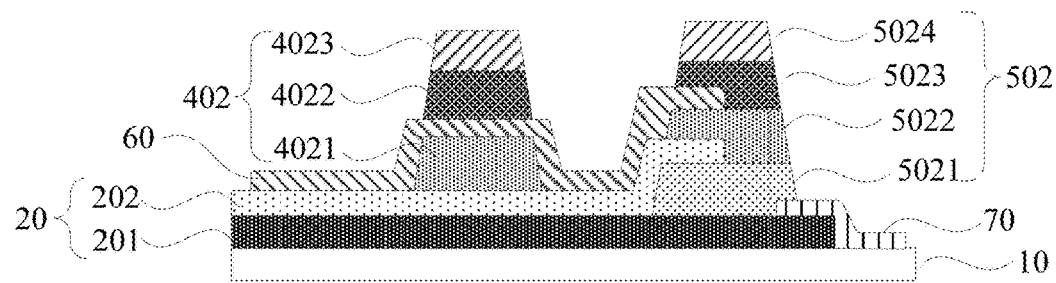
FIG. 5 is a schematic cross-sectional view of FIG. 4 taken along the direction C1C2.

As shown in FIG. 5, the display substrate further includes a first insulating layer 70 at one side of the first conductive pattern 201 away from the base substrate 10. The first insulating layer 70 covers a lateral side of a first edge portion of the first conductive pattern 201, and a surface of the first edge portion distal to the base substrate 10, and the first edge portion is an edge portion of the first conductive pattern 201 away from the array of sub-pixels.

Specifically, when the orthographic projection of the second portion 502 of the first retaining wall structure 50 on the base substrate 10 is located within the orthographic projection of the first conductive pattern 201 on the base substrate 10, and the boundary of the orthographic projection of the second portion 502 on the base substrate 10, which is distal to the sub-pixels, is located between the orthographic projection of the array of sub-pixels on the base substrate 10 and the boundary of the orthographic projection of the first conductive pattern 201 on the base substrate 10, which is distal to the sub-pixels, if one edge portion, i.e., the first edge portion, of the first conductive pattern 201 away from the array of sub-pixels in a direction from the display region 80 to the edge region 81, is not covered by the second portion 502 of the first retaining wall structure 50, then the lateral side of the first edge portion and the surface of the first edge portion distal to the base substrate 10 are exposed, which easily affects the transmission stability of the signal line 20.

In the display substrate provided in the foregoing embodiment, the first insulating layer 70 is provided at one side of the first conductive pattern 201 away from the base substrate 10, and the first insulating layer 70 covers the lateral side of the first edge portion and the surface of the first edge portion distal to the base substrate 10, so that the first edge portion is isolated from the outside, thereby preventing the first edge portion from affecting the transmission stability of the signal line 20 in practical applications.

Figure 13:
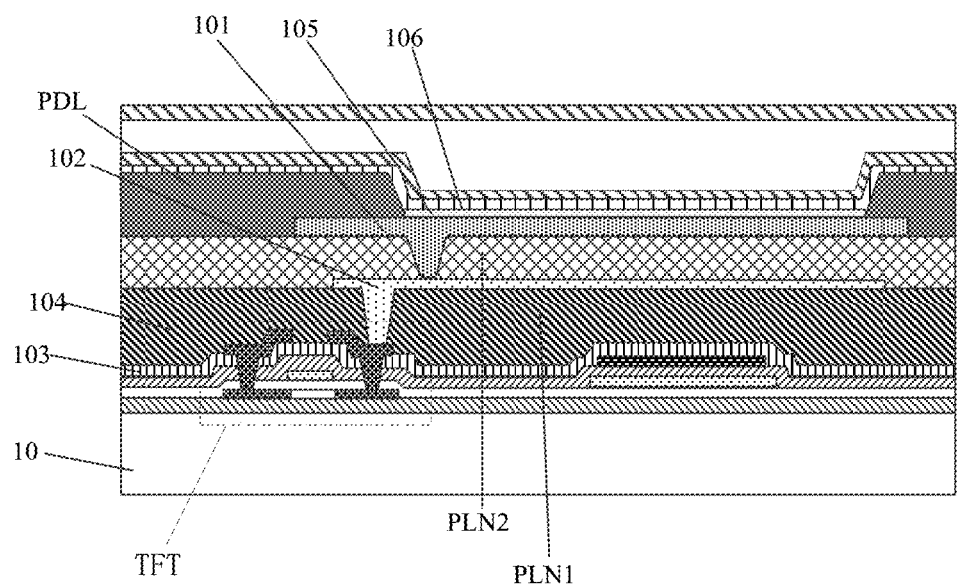
FIG. 13 is a schematic cross-sectional view of a driving transistor and a light-emitting element in a display substrate according to an embodiment of the present disclosure.

As shown in FIG. 13, in some embodiments, the display substrate further includes:
 a plurality of sub-pixel driving circuits, where each of the sub-pixel driving circuits includes a plurality of thin film transistors;
 anode patterns 101 disposed on one side of the plurality of sub-pixel driving circuits distal to the base substrate 10, where the anode patterns 101 are corresponding to the sub-pixel driving circuits in a one-to-one manner;
 a plurality of conductive connection portions 102 arranged between the anode patterns 101 and the sub-pixel driving circuits, where each of the conductive connecting portions 102 is respectively coupled to the corresponding anode pattern 101 and the corresponding sub-pixel driving circuit;
 where the first conductive pattern 201 is in direct contact with the second conductive pattern 202; the first conductive pattern 201 and source and drain electrodes of the thin film transistor include the same material; the second conductive pattern 202 and the conductive connection portion 102 include the same material.

In some embodiments, the display substrate further includes a second insulating layer 103 and a third insulating layer 104. The first conductive pattern 201, the source electrode and the drain electrode of the thin film transistor are all located on one surface of the second insulating layer 103 distal to the base substrate 10. The second conductive pattern 202 and the conductive connection portion 102 are all located on one surface of the third insulating layer 104 distal to the base substrate 10. With this arrangement, the first conductive pattern 201 is arranged in the same layer as the source and drain electrodes of the thin film transistor, and the second conductive pattern 202 is arranged in the same layer as the conductive connection portion 102.

Specifically, as shown in FIG. 13, each of the sub-pixel driving circuits includes a plurality of thin film transistors. The plurality of thin film transistors includes at least one driving transistor with a driving function and a plurality of switching transistors with a switching function. In operation, the plurality of thin film transistors operate together to output a driving signal from an output terminal of the driving transistor.

The display substrate further includes a plurality of light-emitting elements. The plurality of light-emitting elements are correspond to the plurality of sub-pixel driving circuits in a one-to-one manner. Each of the light-emitting elements may include an organic light-emitting material layer 105 and a cathode 106 which are stacked on each other. The organic light-emitting material layer 105 is located between the corresponding anode pattern 101 and the cathode 106.

The driving circuit layer may further include a plurality of conductive connection portions 102. The conductive connection portions 102 are corresponding to the anode patterns 101 in a one-to-one manner. Each conductive connection portion 102 is located between the corresponding anode pattern 101 and the corresponding anode pattern 101. Each conductive connection portion 102 is respectively coupled to the corresponding anode pattern 101 and the corresponding sub-pixel driving circuit. More specifically, the driving transistor includes a source electrode and a drain electrode arranged in the same layer and made of the same material. One of the source electrode and the drain electrode is used as an input electrode of the driving transistor, and the other of the source electrode and the drain electrode is used as an input electrode of the driving transistor. The conductive connection portion 102 is coupled to the output electrode of the driving transistor.

It should be noted that the transistor TFT in FIG. 13 may be used as the driving transistor or as a switching transistor connected between the output electrode of the driving transistor and the anode pattern 101.

When the display substrate is in operation, a driving signal generated by each sub-pixel driving circuit is transmitted to the corresponding anode pattern 101 through the corresponding conductive connection portion 102; under the control of the anode pattern 102 and the cathode 106, the organic light-emitting material layer 105 emits light, thereby realizing the display function of the display substrate.

As described above, the first conductive pattern 201 and the source and drain electrodes of the thin film transistor may be arranged in the same layer and made of the same material, and the second conductive pattern 202 and the conductive connection portion 102 may be arranged in the same layer and made of the same material. This arrangement not only ensures that the first conductive pattern 201 can be directly coupled to the second conductive pattern 202, but also enables the first conductive pattern 201 to be formed in the same patterning process as the source electrode and the drain electrode, as well as enables the second conductive pattern 202 to be formed in the same patterning process as the conductive connection portion 102. This can avoid adding additional patterning processes for the fabrication of the first conductive pattern 201 and the second conductive pattern 202, thereby effectively simplifying the manufacturing process of the display substrate and reducing the manufacturing cost of the display substrate.

As shown in FIG. 5, FIG. 6 and FIG. 7, in some embodiments, the display substrate further includes a compensation conductive pattern 60. The compensation conductive pattern 60 is located on one side of the signal line 20 distal to the base substrate 10, and is coupled to the signal line 20.

Specifically, the driving circuit layer may further include the compensation conductive pattern 60, and the compensation conductive pattern 60 is located on one side of the signal line 20 distal to the base substrate 10 and is coupled to the signal line 20. This not only enables the signal line 20 to be coupled to other conductive functional patterns through the compensation conductive pattern 60, but also is equivalent to increasing the thickness of the signal line 20 in the direction perpendicular to the base substrate 10, which is more conducive to reducing the IR drop of the signal line 20.

As shown in FIG. 7, in some embodiments, a boundary (indicated by 35 shown in FIG. 7) of an orthographic projection of the compensation conductive pattern 60 on the base substrate 10, which is distal to the array of sub-pixels, is located within the orthographic projection of the second portion 502 on the base substrate 10.

Figure 12:
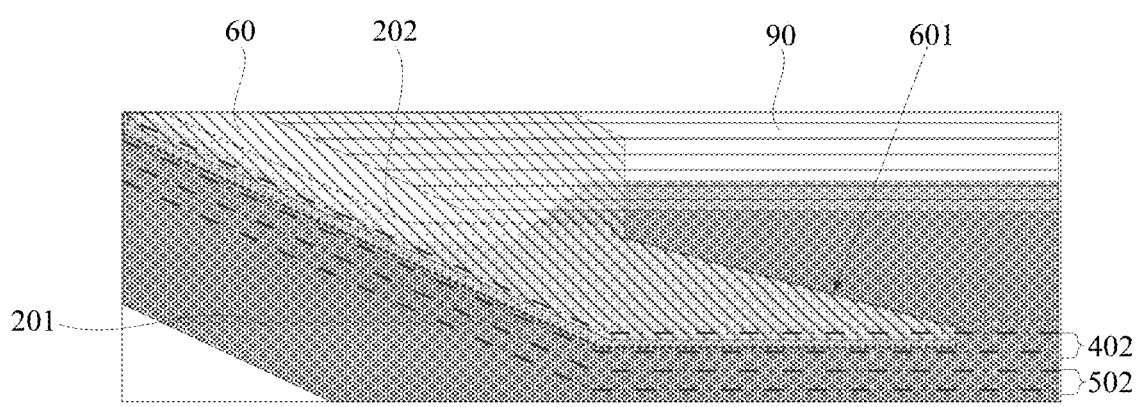
FIG. 12 is a second schematic enlarged view of the part X2 in FIG. 4.

As shown in FIG. 12, in some embodiments, a lateral surface (indicated by 601) of the compensation conductive pattern 60 near the wire-in region may be an oblique lateral surface with a certain inclination angle, thereby increasing a distance between the lateral surface of the compensation conductive pattern 60 near the wire-in region and the display region, and then reducing the risk of water and oxygen entering the display region through the lateral surface.

As shown in FIG. 10, in some embodiments, a lateral surface (indicated by 304) of the second conductive pattern 202 near the wire-in region may be an oblique lateral surface with a certain inclination angle, thereby increasing a distance between the lateral surface of the second conductive pattern 202 near the wire-in region and the display region, and then reducing the risk of water and oxygen entering the display region through the lateral surface.

In addition, both of the lateral surface of the compensation conductive pattern 60 near the wire-in region and the lateral surface of the second conductive pattern 202 near the wire-in region, may be covered by an organic layer. For example, the lateral surface of the compensation conductive pattern 60 near the wire-in region and the lateral surface of the second conductive pattern 202 near the wire-in region may be covered by a second planarization layer (PLN2)/ pixel defining layer (PDL), thereby further reducing the risk of water and oxygen entering the display region through the lateral surfaces.

In some embodiments, the orthographic projection of the fourth portion 402 of the second retaining wall structure 40 on the base substrate 10 is located within the orthographic projection of the compensation conductive pattern 60 on the base substrate 10.

Specifically, the compensation conductive pattern 60 has various structures. For example, an extension direction of the compensation conductive pattern 60 is the same as that of the signal line 20. The boundary of the orthographic projection of the compensation conductive pattern 60 on the base substrate 10, which is close to the sub-pixels, is located between the sub-pixels and the boundary of the orthographic projection of the second conductive pattern 202 on the base substrate 10, which is close to the sub-pixels. The boundary of the orthographic projection of the compensation conductive pattern 60 on the base substrate 10, which is distal to the sub-pixels, is located between the sub-pixels and the boundary of the orthographic projection of the first conductive pattern 201 on the base substrate 10, which is distal to the sub-pixels.

The above arrangement allows the compensation conductive pattern 60 to have a wider width in a direction perpendicular to the extension direction of the signal line 20, which is more conducive to reducing the IR drop of the signal line 20. Further, the boundary of the orthographic projection of the compensation conductive pattern 60 on the base substrate 10, which is distal to the array of sub-pixels, is located within the orthographic projection of the second portion 502 on the base substrate 10, so that the edge of the compensation conductive pattern 60, which is distal to the sub-pixels, can be covered by the second portion 502, thereby avoiding fabrication of an insulating layer for covering the edge.

In some embodiments, the display substrate may further include a fourth insulating layer (indicated by PLN2 in FIG. 13). The compensation conductive pattern 60 and the anode pattern 101 are both located at one surface of the fourth insulating layer distal to the base substrate 10.

Specifically, the compensation conductive pattern 60 and the anode pattern are arranged in the same layer and made of the same material, so that the compensation conductive pattern 60 and the anode pattern can be formed in the same patterning process, thereby avoiding additional patterning process for manufacturing the compensation conductive pattern 60 and then simplifying the manufacturing process of the display substrate and reducing the manufacturing cost.

As shown in FIG. 6, FIG. 7 and FIG. 12, in some embodiments, the display substrate further includes: a common electrode layer 90 disposed on one side of the compensation conductive pattern 60 distal to the base substrate 10. The common electrode layer 90 includes a portion located in the display region 80 and a portion located in the edge region 81. The portion of the common electrode layer 90 located in the edge region 81 is coupled to the compensation conductive pattern 60.

Specifically, specific types of the signal line 20 may be various. For example, the signal line 20 includes a negative power signal line and/or a positive power signal line. When the signal line 20 includes a negative power signal line, the signal line 20 may be coupled to the portion of the common electrode layer 90 located in the edge region 81 through the compensation conductive pattern 60, so that the signal line 20 can transmit a negative power signal to the portion of the common electrode layer 90 located in the display region 80 through the compensation conductive pattern 60 and the portion of the common electrode layer 90 located in the edge region 81.

It is worth noting that the common electrode layer 90 may be used as a cathode located on one side of the organic light-emitting material layer distal to the base substrate 10 in the display substrate.

More specifically, as shown in FIG. 6, there is a first overlapping area A between the orthographic projection of the compensation conductive pattern 60 on the base substrate 10 and an orthographic projection of the common electrode layer 90 on the base substrate 10. The compensation conductive pattern 60 may be coupled to the common electrode layer 90 through a via hole defined in the first overlapping area A.

A gate driving circuit is further disposed in the first overlapping area A. The gate driving circuit includes a plurality of shift register units. Each shift register unit includes a plurality of thin film transistors. The plurality of thin film transistors operate together to generate a gate driving signal, and output the gate driving signal to a gate line located in the display region 80.

Most of conductive patterns included in the shift register unit are arranged in the same layer and made of the same material as the first conductive pattern 201, and a small part of conductive patterns included in the shift register unit are arranged in the same layer and made of the same material as the second conductive pattern 202. Thus, the second conductive patterns 202 extends more toward the first overlapping area A. For example, the boundary of the orthographic projection of the second main portion on the base substrate 10, which is close to the array of sub-pixels, is located between the array of sub-pixels and the boundary of the orthographic projection of the first main portion on the base substrate 10, which is close to the array of sub-pixels. In this way, the width of the signal line 20 in the direction perpendicular to its own extension may be increased to a greater extent, thereby reducing the IR drop of the signal line 20.

In some embodiments, the display substrate further includes:
- a first passivation layer disposed on one side of the plurality of thin film transistors distal to the base substrate 10;
- a first planarization layer PLN1 disposed on one side of the first passivation layer distal to the base substrate 10;
- a second planarization layer PLN2 disposed on one side of the first planarization layer distal to the base substrate 10;
- a pixel defining layer PDL disposed on one side of the second planarization layer PLN2 distal to the base substrate 10;
- a spacer layer disposed on one side of the pixel defining layer distal to the base substrate 10.

Each of the first retaining wall structure 50 and the second retaining wall structure 40 includes a plurality of stacked retaining wall blocks. Each retaining wall block may be in the same layer and made of the same material as any one of the first passivation layer, the first planarization layer, the second planarization layer, the pixel defining layer and the spacer layer.

Specifically, the first passivation layer included in the display substrate covers the surface of the plurality of thin film transistors distal to the base substrate 10, so that the surface of the plurality of thin film transistors distal to the base substrate 10 can be isolated from the outside, thereby ensuring the operation stability of the plurality of thin film transistors.

The first planarization layer and the second planarization layer included in the driving circuit layer are formed on the surface of the first passivation layer distal to the base substrate 10, so that the surface of the first passivation layer distal to the base substrate 10 is flattened to ensure flatness of the anode pattern that is fabricated subsequently.

The pixel defining layer is used to define a plurality of sub-pixel regions on one side of the second planarization layer distal to the base substrate 10. When fabricating the organic light-emitting material layer, organic light-emitting material may be printed into each sub-pixel region through the inkjet printing technology.

The spacer layer may be formed on the surface of the pixel defining layer distal to the base substrate 10, and is used to support a cover plate subsequently covered on the display substrate.

It is worth noting that the first passivation layer may be made of silicon nitride, and each of the first planarization layer, the second planarization layer, the pixel defining layer and the spacer layer may be made of organic materials, such as organic insulating materials including polyimide, polyphthalimide, polyphthalamide, acrylic, benzocyclobutene and phenolic resin.

The specific structures of the first retaining wall structure 50 and the second retaining wall structure 40 are various. For example, each of the first retaining wall structure 50 and the second retaining wall structure 40 includes a plurality of stacked retaining wall blocks. Each retaining wall block may be in the same layer and made of the same material as any one of the first passivation layer, the first planarization layer, the second planarization layer, the pixel defining layer and the spacer layer. When the first retaining wall structure 50 and the second retaining wall structure 40 adopt the above structure, each retaining wall block included in the first retaining wall structure 50 and the second retaining wall structure 40 may be fabricated with other film layer (such as the first passivation layer, the first planarization layer, the second planarization layer, the pixel defining layer and the spacer layer) in the same manufacturing process, thereby avoiding adding additional patterning processes for fabricating the first retaining wall structure 50 and the second retaining wall structure 40, and effectively simplifying the manufacturing process of the display substrate and reducing production cost.

It should be noted that the above "same layer" refers to a layer structure that is formed by using a same film forming process to form a film layer for forming a specific pattern and then performing a patterning process with a same mask. According to different specific patterns, one patterning process may include multiple exposure, development or etching, and the specific patterns in the formed layer structure may be continuous or discontinuous, and these specific patterns may be at different heights or have different thicknesses.

In some embodiments, in the direction perpendicular to the base substrate 10, a height of the first retaining wall structure 50 is higher than a height of the second retaining wall structure 40.

Specifically, since the first retaining wall structure 50 surrounds the second retaining wall structure 40, when packaging the display substrate, the packaging material first flows to the second retaining wall structure 40. The packaging material is blocked by the second retaining wall structure 40. Then, the packaging material flows to the first retaining wall structure 50, and then is blocked by the first retaining wall structure 50.

With the above arrangement, in the direction perpendicular to the base substrate 10, the height of the first retaining wall structure 50 is higher than the height of the second retaining wall structure 40, which not only enables the packaging material to flow over the second retaining wall structure 40 to cover a part of the display substrate between the first retaining wall structure 50 and the second retaining wall structure 40, but also enables the first retaining wall structure 50 to effectively block the packaging material flowing between the first retaining wall structure 50 and the second wall structure 40, thereby ensuring the packaging effect of the display substrate.

As shown in FIG. 5, in some embodiments, the first retaining wall structure 50 includes a first retaining wall block 5021, a second retaining wall block 5022, a third retaining wall block 5023 and a fourth retaining wall block 5024, which are sequentially stacked in a direction away from the base substrate 10. The first retaining wall block 5021 is in the same layer and made of the same material as the first planarization layer. The second retaining wall block 5022 is in the same layer and made of the same material as the second planarization layer. The third retaining wall block 5023 is in the same layer and made of the same material as the pixel defining layer. The fourth retaining wall block 5024 is in the same layer and made of the same material as the spacer layer.

The first retaining wall structure 50 may adopt the above structure, so that the first retaining wall block 5021 and the first planarization layer may be formed in a same patterning process, the second retaining wall block 5022 and the second planarization layer may be formed in a same patterning process, the third retaining wall block 5023 and the pixel defining layer may be formed in a same patterning process, and the fourth retaining wall block 5024 and the spacer layer may be formed in a same patterning process, thereby avoiding adding additional patterning process for fabricating the first retaining wall structure 50, and effectively simplifying the manufacturing process of the display substrate and reducing production cost.

In some embodiments, the second retaining wall structure 40 includes a fifth retaining wall block 4021, a sixth retaining wall block 4022 and a seventh retaining wall block 4023 that are sequentially stacked in the direction away from the base substrate 10. The fifth retaining wall block 4021 is in the same layer and made of the same material as the second planarization layer. The sixth retaining wall block 4022 is in the same layer and made of the same material as the pixel defining layer. The seventh retaining wall block 4023 is in the same layer and made of the same material as the spacer layer.

The second retaining wall structure may adopt the above structure, so that the fifth blocking wall block 4021 and the second planarization layer may be formed in a same patterning process, the sixth blocking wall block 4022 and the pixel defining layer may be formed in a same patterning process, and the seventh retaining wall block 4023 and the spacer layer may be formed in a same patterning process, thereby avoiding adding additional patterning process for fabricating the second retaining wall structure 40, and effectively simplifying the manufacturing process of the display substrate and reducing production cost.

Further, the compensation conductive pattern 60 includes a portion located between the second retaining wall block 5022 and the third retaining wall block 5023, and a portion located between the fifth retaining wall block 4021 and the sixth retaining wall block 4022.

Specifically, in case that the orthographic projection of the second portion 502 of the first retaining wall structure 50 on the base substrate 10 partially overlaps the orthographic projection of the compensation conductive pattern 60 on the base substrate 10, and the orthographic projection of the fourth portion 402 of the second retaining wall structure 40 on the base substrate 10 is located within the orthographic projection of the compensation conductive pattern 60 on the base substrate 10, when the compensation conductive pattern 60 and the anode pattern are in a same layer and made of the same material, the second retaining wall block 5022 and the second planarization layer are in a same layer and made of the same material, the third retaining wall block 5023 and the pixel defining layer are in a same layer and made of the same material, since the anode pattern is formed between the second planarization layer and the pixel defining layer, then the compensation conductive pattern 60 also includes one portion located between the second retaining wall block 5022 and the third retaining wall block 5023, and one portion located between the fifth retaining wall block 4021 and the sixth retaining wall block 4022.

In addition, the compensation conductive pattern 60 further includes a portion located between the first retaining wall structure 50 and the second retaining wall structure 40, and a portion located between the second retaining wall structure 40 and the display region 80. The compensation conductive pattern 60 is coupled to the second conductive pattern 202 of the signal line 20 through the portion of the compensation conductive pattern 60 located between the first retaining wall structure 50 and the second retaining wall structure 40, and the portion of the compensation conductive pattern 60 located between the second retaining wall structure 40 and the display region 80.

In some embodiments, the second conductive pattern 202 includes a portion located between the first retaining wall block 5021 and the second retaining wall block 5022.

Specifically, in case that the orthographic projection of the second portion 502 on the base substrate 10 at least partially overlaps the orthographic projection of the second conductive pattern 202 on the base substrate 10, and an orthographic projection of an edge of the second conductive pattern 202 close to the display region 80 on the base substrate 10 is located between the display region 80 and an orthographic projection of an edge of the second portion 502 close to the display region 80 on the base substrate 10, when the second conductive pattern 202 and the conductive connection portion are in the same layer and made of the same material, the first retaining wall block 5021 and the first planarization layer are in a same layer and made of the same material, as well as the second retaining wall block 5022 and the second planarization layer are in a same layer and made of the same material, since the conductive connection portion is formed between the first planarization layer and the second planarization layer, the second conductive pattern 202 includes one portion located between the first retaining wall block 5021 and the second retaining wall block 5022.

In addition, the second conductive pattern 202 further includes a portion located on one side of the second retaining wall structure 40 facing the base substrate 10. The portion of the second conductive pattern 20, which is located on one side of the second retaining wall structure 40 facing the base substrate 10, is directly formed on one surface of the first conductive pattern 201 and is electrically connected to the first conductive pattern 201.

In some embodiments, the orthographic projection of the first conductive pattern 201 on the base substrate 10 coincides with the orthographic projection of the second conductive pattern 202 on the base substrate 10, and the display substrate further includes:

a fifth insulating layer located on one side of the second conductive pattern 202 distal to the base substrate 10, where the fifth insulating layer covers a lateral side of a second edge portion of the second conductive pattern 202 and one surface of the second edge portion distal to the base substrate 10, the second edge portion is an edge portion of the second conductive pattern 202 away from the array of sub-pixels in a direction from the sub-pixels to the edge region 81;

The fifth insulating layer further covers a lateral side of a first edge portion of the first conductive pattern 201, and the first edge portion is an edge portion of the first conductive pattern 201 away from the array of sub-pixels in the direction from the sub-pixels to the edge region 81.

Specifically, in case that the orthographic projection of the second portion 502 of the first retaining wall structure 50 on the base substrate 10 is located within the orthographic projection of the second conductive pattern 202 on the base substrate 10, the orthographic projection of the fourth portion 402 of the second retaining wall structure 40 on the base substrate 10 is located within the orthographic projection of the second conductive pattern 202 on the base substrate 10, and the orthographic projection of the first conductive pattern 201 on the base substrate 10 coincides with the orthographic projection of the second conductive pattern 202 on the base substrate 10, one edge portion, i.e., the second edge portion, of the second conductive pattern 202 away from the array of sub-pixels in the direction from the sub-pixels to the edge region 81, is not covered by the second portion 502 of the first retaining wall structure 50, then the lateral side of the second edge portion and the surface of the second edge portion distal to the base substrate 10 are exposed, which easily affects the transmission stability of the signal line 20. Similarly, in the direction from the sub-pixels to the edge region 81, a lateral side of one edge portion of the first conductive pattern 201 away from the array of sub-pixels, i.e., the lateral side of the first edge portion, is exposed.

In the display substrate provided in the foregoing embodiment, the first insulating layer 70 is provided at one side of the first conductive pattern 201 away from the base substrate 10, and the first insulating layer 70 covers the lateral side of the first edge portion and the surface of the first edge portion distal to the base substrate 10 as well as the lateral side of the second edge portion, so that the first edge portion and the second edge portion are isolated from the outside, thereby preventing the first edge portion and the second edge portion from affecting the transmission stability of the signal line 20 in practical applications.

In some embodiments, the signal line 20 surrounds the array of sub-pixels.

Specifically, the specific layout of the signal line 20 is various. For example, the signal line 20 is arranged to surround the array of sub-pixels. This arrangement is more conducive to the coupling of the signal line 20 and the sub-pixel driving circuit in the display region.

One embodiment of the present disclosure further provides a display device, including the display substrate provided in the foregoing embodiments.

In the display substrate of the foregoing embodiments, the signal line 20 includes the first conductive pattern 201 and the second conductive pattern 202 which are stacked on each other, thereby increasing a thickness of the signal line 20 in a direction perpendicular to the base substrate 10. Meanwhile, the orthographic projection of the second portion 502 on the base substrate 10 is located within the orthographic projection of the first conductive pattern 201 on the base substrate 10; the orthographic projection of the second portion 502 on the base substrate 10 at least partially overlaps the orthographic projection of the second conductive pattern 202 on the base substrate 10; the orthographic projection of the edge of the second portion 502 away from the display region 80 on the base substrate 10 is located between the display region 80 and the orthographic projection of the edge of first conductive pattern 201 away from the display region 80 on the base substrate 10; the orthographic projection of the edge of the second conductive pattern 202 close to the display region 80 on the base substrate 10 is located between the display region 80 and the orthographic projection of the edge of the second portion 502 close to the display region 80 on the base substrate 10. In this way, the signal line 20 has a wider width in the direction perpendicular to the extension direction of the signal line 20, which is more conducive to reducing the IR drop of the signal line 20 and improving the display uniformity of the display substrate. Therefore, the display device according to one embodiment of the present disclosure includes the display substrate provided in the foregoing embodiments and thus has the above beneficial effect, which will not be repeated here.

It should be noted that the display device may be any product or component having a display function, such as a TV, a monitor, a digital photo frame, a mobile phone, and a tablet computer.

One embodiment of the present disclosure further provides a method for manufacturing display substrates, which is used to manufacture the display substrate provided in the foregoing embodiments. The method includes:

forming an array of sub-pixels, a signal line and a first retaining wall structure 50 on a base substrate 10; where the signal line 20 includes a first conductive pattern 201 and a second conductive pattern 202 that are stacked on each other, the first conductive pattern 201 is located between the second conductive pattern 202 and the base substrate 10; the first retaining wall structure 50 surrounds the array of sub-pixels and includes a first portion 501 and a second portion 502; an orthographic projection of the first portion 501 on the base substrate 10 does not overlap with an orthographic projection of the signal line 20 on the base substrate 10; an orthographic projection of the second portion 502 on the base substrate 10 is at least partially overlapped with an orthographic projection of the first conductive pattern 201 on the base substrate 10; a boundary of the orthographic projection of the second portion 502 on the base substrate 10, which is distal to the array of sub-pixels, is located between an orthographic projection of the array of sub-pixels on the base substrate 10, and a boundary of the orthographic projection of the first conductive pattern 201 on the base substrate 10, which is distal to the array of sub-pixels; the orthographic projection of the second portion 502 on the base substrate 10 is partially overlapped with an orthographic projection of the second conductive pattern 202 on the base substrate 10; a boundary of the orthographic projection of the second conductive pattern 202 on the base substrate 10, which is close to the array of sub-pixels, is located between the orthographic projection of the array of sub-pixels on the base substrate, and a boundary of the orthographic projection of the second portion 502 on the base substrate 10, which is close to the array of sub-pixels.

Specifically, the display substrate includes a display region 80 and an edge region 81 surrounding the display region 80. Taking a rectangular display substrate as an example, the display region 80 is a rectangle, and is provided with a plurality of sub-pixels arranged in arrays. The edge region 81 surrounds four sides of the display region 80. The edge region 81 is bound with a chip, and is further provided with the signal line 20 coupled with the chip. The binding position of the chip and the arrangement of the signal line 20 may be set according to actual needs. As shown in FIG. 4, for example, the chip is bound on one side of the display substrate, and the signal line 20 extends along the other three sides of the display substrate. Two ends of the signal line 20 are coupled to the chip. The two ends of the signal line 20 are located in a wire-in region of the display substrate.

The first retaining wall structure 50 has various structures. For example, the first retaining wall structure 50 surrounds the array of sub-pixels, and the first retaining wall structure 50 may be divided into a first portion 501 and a second portion 502. An orthographic projection of the first portion 501 on the base substrate 10 does not overlap with an orthographic projection of the signal line 20 on the base substrate 10. An orthographic projection of the second portion 502 on the base substrate 10 at least partially overlaps with the orthographic projection of the first conductive pattern 201 on the base substrate 10. The orthographic projection of the second portion 502 on the base substrate 10 at least partially overlaps with the orthographic projection of the second conductive pattern 202 on the base substrate 10.

Meanwhile, a boundary of the orthographic projection of the second portion 502 on the base substrate 10, which is distal to the array of sub-pixels, is located between the orthographic projection of the array of sub-pixels on the base substrate, and a boundary of the orthographic projection of the first conductive pattern 201 on the base substrate 10, which is distal to the array of sub-pixels. A boundary of the orthographic projection of the second conductive pattern 202 on the base substrate 10, which is close to the array of sub-pixels, is located between the orthographic projection of the array of sub-pixels on the base substrate 10, and a boundary of the orthographic projection of the second portion 502 on the base substrate 10, which is close to the array of sub-pixels. The first retaining wall structure 50 and the signal line 20 of the above structure enable the first conductive pattern 201 to have a wider width in a direction perpendicular to an extension direction of the first conductive pattern 201. Meanwhile, the first retaining wall structure 50 and the signal line 20 of the above structure enable the second conductive pattern 202 to have a wider width in a direction perpendicular to an extension direction of the second conductive pattern 202. In this way, the width of the signal line 20 in a direction perpendicular to an extension direction of the signal line 20 is increased, which is more conducive to reducing the IR drop of the signal line 20.

In the display substrate manufactured by the method according to one embodiment of the present disclosure, the signal line 20 has a thicker thickness in the direction perpendicular to the base substrate 10, and the signal line 20 has a wider width in the direction perpendicular to the extension direction of the signal line 20, therefore, the display substrate according to the embodiment of the present disclosure is more conducive to reducing the IR drop of the signal line 20 and improving the display uniformity of the display substrate.

It should be noted that the embodiments in this specification are described in a progressive manner. The same or similar parts between the embodiments can be referred to each other. Each embodiment focuses on differences from other embodiments. In particular, for the method embodiments, since they are basically similar to the product embodiments and thus the description thereof is relatively simple, and the relevant parts can be referred to the description of the product embodiments.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Such words as "comprises" or "include" mean that an element or object appearing before the word covers elements or objects listed after the word and their equivalents, but do not exclude other elements or objects. Similarly, such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

It will be understood that when an element such as a layer, film, region, or substrate is referred to as being "on" or "under" another element, this element may be "directly" on or "under" the other element, or, there may be an intermediate element therebetween.

In the description of the above embodiments, specific features, structures, materials or characteristics may be combined in any suitable manner in any one or more embodiments or examples.

The above are merely the embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure. The protection scope of the present disclosure shall be subject to the protection scope of the claims.

The invention claimed is:

1. A display substrate, comprising:
   a base substrate;
   an array of sub-pixels on the base substrate;
   a signal line; wherein the signal line includes a first conductive pattern and a second conductive pattern which are stacked on each other, and the first conductive pattern is located between the base substrate and the second conductive pattern;
   a first retaining wall structure; wherein the first retaining wall structure surrounds the array of sub-pixels; the first retaining wall structure includes a first portion and a second portion; an orthographic projection of the first portion on the base substrate does not overlap with an orthographic projection of the signal line on the base substrate; an orthographic projection of the second portion on the base substrate is partially overlapped with an orthographic projection of the first conductive pattern on the base substrate; a boundary of the orthographic projection of the second portion on the base substrate, which is distal to the array of sub-pixels, is located between an orthographic projection of the array of sub-pixels on the base substrate, and a boundary of the orthographic projection of the first conductive pattern on the base substrate, which is distal to the array of sub-pixels; the orthographic projection of the second portion on the base substrate is partially overlapped with an orthographic projection of the second conductive pattern on the base substrate; a boundary of the orthographic projection of the second conductive pattern on the base substrate, which is close to the array of sub-pixels, is located between the orthographic projection of the array of sub-pixels on the base substrate, and a boundary of the orthographic projection of the second portion on the base substrate, which is close to the array of sub-pixels.

2. The display substrate according to claim 1, wherein the display substrate further includes a second retaining wall structure;
   wherein the second retaining wall structure surrounds the array of sub-pixels; an orthographic projection of the second retaining wall structure on the base substrate is located between the orthographic projection of the first wall structure on the base substrate and the orthographic projection of the array of sub-pixels on the base substrate; the second retaining wall structure includes a third portion and a fourth portion; an orthographic projection of the third portion on the base substrate does not overlap with the orthographic projection of the signal line on the base substrate; an orthographic projection of the fourth portion on the base substrate at least partially overlaps the orthographic projection of the first conductive pattern on the base substrate; the orthographic projection of the fourth portion on the base substrate at least partially overlaps the orthographic projection of the second conductive pattern on the base substrate.

3. The display substrate according to claim 2, wherein a boundary of the orthographic projection of the first conductive pattern on the base substrate, which is close to the array of sub-pixels, is located between the orthographic projection of the array of sub-pixels on the base substrate, and a boundary of the orthographic projection of the fourth portion on the base substrate, which is close to the array of sub-pixels; and/or, a boundary of the orthographic projection of the second conductive pattern on the base substrate, which is close to the array of sub-pixels, is located between the orthographic projection of the array of sub-pixels on the base substrate, and a boundary of the orthographic projection of the fourth portion on the base substrate, which is close to the array of sub-pixels.

4. The display substrate according to claim 2, wherein the second conductive pattern includes a second transition portion and a second main portion, the second main portion is coupled with the second transition portion;

a boundary of an orthographic projection of the second transition portion on the base substrate, which is distal to the array of sub-pixels, is located within the orthographic projection of the fourth portion on the base substrate.

5. The display substrate according to claim 2, wherein the second conductive pattern includes a second transition portion and a second main portion, and the second main portion is coupled with the second transition portion;

a boundary of an orthographic projection of the second main portion on the base substrate, which is distal to the array of sub-pixels, is located within the orthographic projection of the second portion on the base substrate.

6. The display substrate according to claim 2, wherein the second conductive pattern further includes a first lateral side; an orthographic projection of the first lateral side on the base substrate is located between the orthographic projection of the first retaining wall structure on the base substrate and the orthographic projection of the second retaining wall structure on the base substrate.

7. The display substrate according to claim 6, wherein the first lateral side is located at a corner area of the display substrate.

8. The display substrate according to claim 2, wherein the first conductive pattern includes a first transition portion and a first main portion, and the first main portion is coupled with the first transition portion; the second conductive pattern includes a second transition portion and a second main portion, and the second main portion is coupled with the second transition portion;

a boundary of an orthographic projection of the second main portion on the base substrate, which is close to the array of sub-pixels, is located between the orthographic projection of the array of sub-pixels on the base substrate and a boundary of an orthographic projection of the first main portion on the base substrate, which is close to the array of sub-pixels.

9. The display substrate according to claim 2, wherein the first conductive pattern includes a first transition portion and a first main portion, and the first main portion is coupled with the first transition portion;

the second conductive pattern includes a second transition portion and a second main portion, and the second main portion is coupled with the second transition portion;

a part of a boundary of an orthographic projection of the second transition portion on the base substrate, which is close to the array of sub-pixels, is located between the orthographic projection of the array of sub-pixels on the base substrate and a boundary of an orthographic projection of the first transition portion on the base substrate, which is close to the array of sub-pixels;

another part of the boundary of the orthographic projection of the second transition portion on the base substrate, which is close to the array of sub-pixels, is located within the orthographic projection of the first transition portion on the base substrate.

10. The display substrate according to claim 1, wherein the display substrate further includes a wire-in region; the orthographic projection of the first conductive pattern on the base substrate at least partially overlaps with the wire-in region; and the orthographic projection of the second conductive pattern on the base substrate does not overlap with the wire-in region.

11. The display substrate according to claim 1, wherein the display substrate further includes a corner area and a straight-edge area; in a direction perpendicular to an extension direction of the first conductive pattern, a width of the first conductive pattern in the corner area is greater than a width of the first conductive pattern in the straight-edge area.

12. The display substrate according to claim 11, wherein in a direction from the corner area to the straight-edge area, a distance between the boundary of the orthographic projection of the first conductive pattern on the base substrate, which is distal to the array of sub-pixels, and the boundary of the orthographic projection of the second portion on the base substrate, which is distal to the array of sub-pixels, is gradually decreased.

13. The display substrate according to claim 1, wherein the display substrate further includes a first insulating layer at one side of the first conductive pattern away from the base substrate;

the first insulating layer covers a lateral side of a first edge portion of the first conductive pattern, and a surface of the first edge portion distal to the base substrate; and the first edge portion is an edge portion of the first conductive pattern away from the array of sub-pixels.

14. The display substrate according to claim 2, wherein the display substrate further includes:

a plurality of sub-pixel driving circuits, wherein each of the plurality of sub-pixel driving circuits includes a plurality of thin film transistors;

anode patterns disposed on one side of the plurality of sub-pixel driving circuits distal to the base substrate, wherein the anode patterns are corresponding to the plurality of sub-pixel driving circuits in a one-to-one manner;

a plurality of conductive connection portions arranged between the anode patterns and the plurality of sub-pixel driving circuits, wherein each of the plurality of conductive connecting portions is respectively coupled to the corresponding anode pattern and the corresponding sub-pixel driving circuit;

wherein the first conductive pattern is in direct contact with the second conductive pattern; the first conductive pattern and source and drain electrodes of the plurality of thin film transistors include the same material; the second conductive pattern and the plurality of conductive connection portions include the same material.

15. The display substrate according to claim 14, wherein the display substrate further includes a second insulating layer and a third insulating layer;
the first conductive pattern, the source and drain electrodes of the plurality of thin film transistors are all located on one surface of the second insulating layer distal to the base substrate;
the second conductive pattern and the plurality of conductive connection portions are all located on one surface of the third insulating layer distal to the base substrate.

16. The display substrate according to claim 14, wherein the display substrate further includes a compensation conductive pattern; the compensation conductive pattern is located on one side of the signal line distal to the base substrate, and is coupled to the signal line.

17. The display substrate according to claim 16, wherein a boundary of an orthographic projection of the compensation conductive pattern on the base substrate, which is distal to the array of sub-pixels, is located within the orthographic projection of the second portion on the base substrate.

18. The display substrate according to claim 16, wherein the orthographic projection of the fourth portion of the second retaining wall structure on the base substrate is located within the orthographic projection of the compensation conductive pattern on the base substrate.

19. The display substrate according to claim 16, wherein the display substrate further includes a fourth insulating layer; the compensation conductive pattern and the anode patterns are located on one surface of the fourth insulating layer distal to the base substrate.

20. The display substrate according to claim 16, wherein the display substrate further includes a common electrode layer disposed on one side of the compensation conductive pattern distal to the base substrate; the common electrode layer includes a portion located in a display region of the display substrate and a portion located in an edge region of the display substrate; the portion of the common electrode layer located in the edge region is coupled to the compensation conductive pattern.

21. The display substrate according to claim 16, wherein the display substrate further includes:
a first passivation layer disposed on one side of the plurality of thin film transistors distal to the base substrate;
a first planarization layer disposed on one side of the first passivation layer distal to the base substrate;
a second planarization layer disposed on one side of the first planarization layer distal to the base substrate;
a pixel defining layer disposed on one side of the second planarization layer distal to the base substrate;
a spacer layer disposed on one side of the pixel defining layer distal to the base substrate;
wherein the first retaining wall structure includes a first retaining wall block, a second retaining wall block, a third retaining wall block and a fourth retaining wall block, which are sequentially stacked in a direction away from the base substrate;
the first retaining wall block is in the same layer and made of the same material as the first planarization layer; the second retaining wall block is in the same layer and made of the same material as the second planarization layer; the third retaining wall block is in the same layer and made of the same material as the pixel defining layer; the fourth retaining wall block is in the same layer and made of the same material as the spacer layer; the second retaining wall structure includes a fifth retaining wall block, a sixth retaining wall block and a seventh retaining wall block that are sequentially stacked in the direction away from the base substrate; the fifth retaining wall block is in the same layer and made of the same material as the second planarization layer; the sixth retaining wall block is in the same layer and made of the same material as the pixel defining layer; the seventh retaining wall block is in the same layer and made of the same material as the spacer layer.

22. The display substrate according to claim 21, wherein the compensation conductive pattern includes a portion located between the second retaining wall block and the third retaining wall block, and a portion located between the fifth retaining wall block and the sixth retaining wall block.

23. The display substrate according to claim 21, wherein the second conductive pattern includes a portion located between the first retaining wall block and the second retaining wall block.

24. The display substrate according to claim 1, wherein the signal line includes a positive power signal line and/or a negative power signal line.

25. The display substrate according to claim 1, wherein the signal line surrounds the array of sub-pixels.

26. A display device, comprising the display substrate according to claim 1.

27. A method for manufacturing a display device, comprising:
forming an array of sub-pixels, a signal line and a first retaining wall structure on a base substrate; wherein the signal line includes a first conductive pattern and a second conductive pattern that are stacked on each other, the first conductive pattern is located between the second conductive pattern and the base substrate; the first retaining wall structure surrounds the array of sub-pixels and includes a first portion and a second portion; an orthographic projection of the first portion on the base substrate does not overlap with an orthographic projection of the signal line on the base substrate; an orthographic projection of the second portion on the base substrate is at least partially overlapped with an orthographic projection of the first conductive pattern on the base substrate; a boundary of the orthographic projection of the second portion on the base substrate, which is distal to the array of sub-pixels, is located between an orthographic projection of the array of sub-pixels on the base substrate, and a boundary of the orthographic projection of the first conductive pattern on the base substrate, which is distal to the array of sub-pixels; the orthographic projection of the second portion on the base substrate is partially overlapped with an orthographic projection of the second conductive pattern on the base substrate; a boundary of the orthographic projection of the second conductive pattern on the base substrate, which is close to the array of sub-pixels, is located between the orthographic projection of the array of sub-pixels on the base substrate, and a boundary of the orthographic projection of the second portion on the base substrate, which is close to the array of sub-pixels.

* * * * *